(12) United States Patent
Emadi et al.

(10) Patent No.: US 12,009,352 B2
(45) Date of Patent: Jun. 11, 2024

(54) FABRICATING WAFERS WITH ELECTRICAL CONTACTS ON A SURFACE PARALLEL TO AN ACTIVE SURFACE

(71) Applicant: ILLUMINA, INC., San Diego, CA (US)

(72) Inventors: Arvin Emadi, San Diego, CA (US); Jon Aday, San Diego, CA (US); Ali Agah, San Diego, CA (US); Arnaud Rival, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 180 days.

(21) Appl. No.: 17/419,385

(22) PCT Filed: Sep. 16, 2020

(86) PCT No.: PCT/US2020/051117
§ 371 (c)(1),
(2) Date: Jun. 29, 2021

(87) PCT Pub. No.: WO2021/061474
PCT Pub. Date: Apr. 1, 2021

(65) Prior Publication Data
US 2022/0216191 A1    Jul. 7, 2022

Related U.S. Application Data

(60) Provisional application No. 62/906,515, filed on Sep. 26, 2019.

(51) Int. Cl.
*H01L 25/16*    (2023.01)
*G01N 21/64*    (2006.01)
(Continued)

(52) U.S. Cl.
CPC ....... *H01L 25/167* (2013.01); *G01N 21/6454* (2013.01); *H01L 21/304* (2013.01);
(Continued)

(58) Field of Classification Search
CPC ... G01N 21/6454; H01L 21/304; H01L 21/56; H01L 21/78; H01L 23/3128; H01L 24/11;
(Continued)

(56) References Cited

U.S. PATENT DOCUMENTS

2009/0280602 A1* 11/2009 Bonifield ............. B81C 1/0023
438/118
2011/0183464 A1* 7/2011 Takahashi ........... H01L 21/6836
257/E21.511
(Continued)

FOREIGN PATENT DOCUMENTS

KR    101812980 B1    12/2017

OTHER PUBLICATIONS

International Search Report and Written Opinion of the International Searching Authority for International Application No. PCT/US2020/051117 dated Dec. 8, 2020.

*Primary Examiner* — Mark W Tornow
(74) *Attorney, Agent, or Firm* — Heslin Rothenberg Farley and Mesiti, P.C.

(57) ABSTRACT

Provided herein include various examples of a method for manufacturing aspects of an apparatus, a sensor system. The method may include obtaining a first carrier bonded to an upper surface of the silicon wafer. This wafer includes through silicon vias (TSVs) extended through openings in a passivation stack, with electrical contacts coupled to portions of the TSVs exposed through these openings. The method may include de-bonding the first carrier from the upper surface of the silicon wafer. The method may include dicing the silicon wafer into subsections comprising dies.

20 Claims, 17 Drawing Sheets

(51) Int. Cl.
*H01L 21/304* (2006.01)
*H01L 21/56* (2006.01)
*H01L 21/78* (2006.01)
*H01L 23/00* (2006.01)
*H01L 23/31* (2006.01)

(52) U.S. Cl.
CPC .............. *H01L 21/56* (2013.01); *H01L 21/78* (2013.01); *H01L 23/3128* (2013.01); *H01L 24/11* (2013.01); *H01L 24/13* (2013.01); *H01L 24/97* (2013.01); *H01L 2224/02333* (2013.01); *H01L 2224/02379* (2013.01); *H01L 2224/13008* (2013.01); *H01L 2224/13009* (2013.01); *H01L 2224/97* (2013.01)

(58) Field of Classification Search
CPC ........... H01L 24/13; H01L 2224/02379; H01L 2224/13008; H01L 2224/97
See application file for complete search history.

(56) References Cited

U.S. PATENT DOCUMENTS

| | | | |
|---|---|---|---|
| 2013/0026643 A1 | 1/2013 | England et al. | |
| 2013/0273691 A1* | 10/2013 | Pascual | H01L 24/97 |
| | | | 438/107 |
| 2013/0277785 A1* | 10/2013 | Chen | H01L 27/14632 |
| | | | 257/432 |
| 2017/0018476 A1 | 1/2017 | Wang | |
| 2017/0197821 A1 | 7/2017 | Chu et al. | |
| 2018/0130760 A1 | 5/2018 | Wang et al. | |
| 2019/0088463 A1 | 3/2019 | Li et al. | |
| 2020/0373340 A1* | 11/2020 | Emadi | H01L 27/14698 |
| 2023/0146020 A1* | 5/2023 | Billa | B01L 3/502707 |
| | | | 422/82.07 |

* cited by examiner

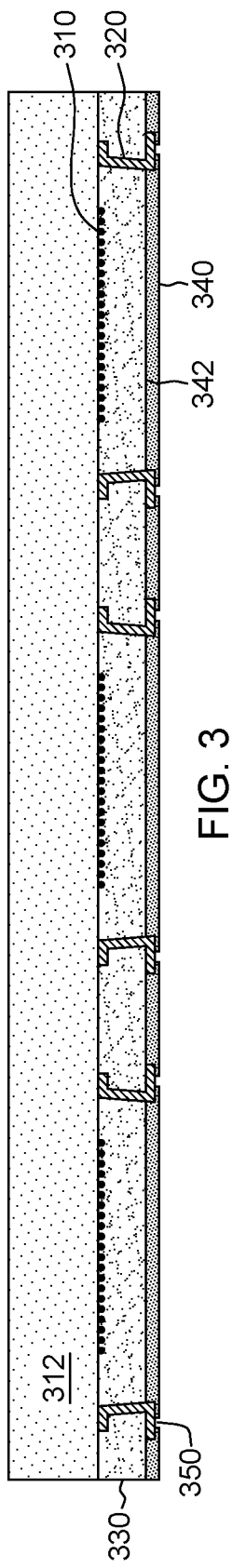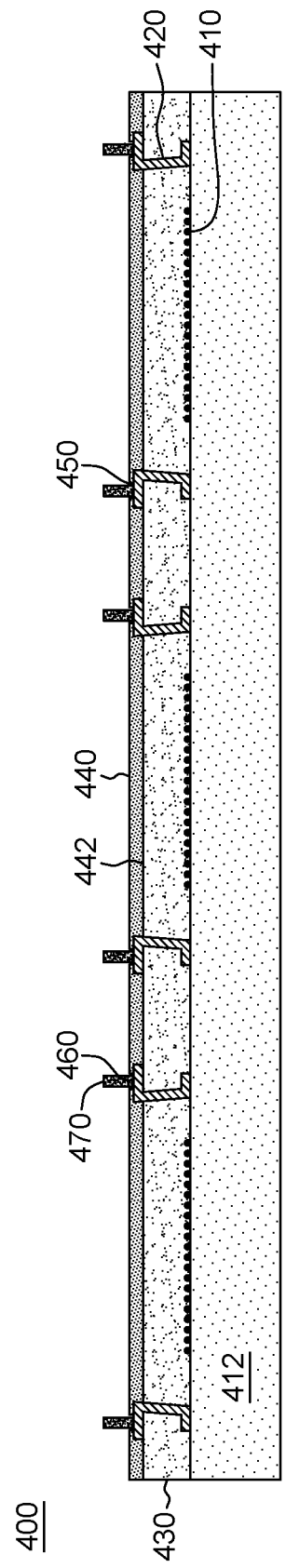

FABRICATING WAFERS WITH ELECTRICAL CONTACTS ON A SURFACE PARALLEL TO AN ACTIVE SURFACE

CROSS REFERENCE TO RELATED APPLICATIONS

This application is a national stage filing under 35 U.S.C. § 371 of International Application No. PCT/US2020/051117, filed, Sep. 16, 2020, and claims the benefit of and priority to U.S. Provisional Patent Application No. 62/906,515, filed Sep. 26, 2019. The contents of each of the prior applications are incorporated by reference herein in their entireties and for all purposes.

BACKGROUND

Various protocols in biological or chemical research involve performing controlled reactions. The designated reactions can then be observed or detected and subsequent analysis can help identify or reveal properties of chemicals involved in the reaction. In some multiplex assays, an unknown analyte having an identifiable label (e.g., fluorescent label) can be exposed to thousands of known probes under controlled conditions. Each known probe can be deposited into a corresponding well of a microplate. Observing any chemical reactions that occur between the known probes and the unknown analyte within the wells can help identify or reveal properties of the analyte. Other examples of such protocols include known DNA sequencing processes, such as sequencing-by-synthesis (SBS) or cyclic-array sequencing.

In some fluorescent-detection protocols, an optical system is used to direct excitation light onto fluorophores, e.g., fluorescently-labeled analytes and to also detect the fluorescent emissions signal light that can emit from the analytes having attached fluorophores. However, such optical systems can be relatively expensive and involve a relatively large benchtop footprint. For example, the optical system can include an arrangement of lenses, filters, and light sources. In other proposed detection systems, the controlled reactions in a flow cell are defined by a solid-state light sensor array (e.g., a complementary metal oxide semiconductor (CMOS) detector). These systems do not involve a large optical assembly to detect the fluorescent emissions. However, in some existing flow cells, which include a CMOS, to enable the functionality, the top layer is not fully transparent or does not include light diffusive or light scattering features, because in these example flow cells these features can block or perturb the excitation or emission light paths. Thus, certain mechanisms which improve the performance of non-CMOS flow cells, such as the integration of electrical components (e.g., electrodes) or physical structures (e.g., herringbone trenches), which achieve faster SBS kinetics), are precluded, affecting the performance of these flow cells in SBS.

SUMMARY

Accordingly, it may be beneficial for the flow cell to be a small and inexpensive device. In a relatively small flow cell, it may be beneficial to utilize as much of the sensor active area of the light detection device as possible and/or provide as large as a sensor or detector active area as possible. This sensor or detector area (referred to as an active surface) can include a surface of the detector and an area packaged with the detector; this area extends a horizontal distance beyond the detector (e.g., a fan-out region). In examples where a CMOS sensor is utilized as a detector in the flow cell, the fan-out refers to the additional horizontal distance on each side of the horizontal boundaries of the CMOS sensor. In these configurations, to enable electrical connections to the sensor area, bumps are formed on the front side of a CMOS detector. But when utilizing a CMOS sensor as a detection device and/or image sensor, this surface, including a fan-out region that extends the surface, is an active surface and its flatness and transparency above the active surface is relevant to its utility. Therefore, bumps to this surface adversely impact this functionality. In some examples, the formation of which are described herein, bumps are added to a backside of a CMOS (light) detection device, on a bond through-silicon via (TSV) pad, which is possible because one or more TSVs provide an electrical connection from the active (i.e., light sensitive) surface of the CMOS detector to the TSV pad (i.e., the back surface of the CMOS image sensor), by extending through at least one base substrate to at least one redistribution layer (RDL).

Activities for which the resultant device is utilized, including, DNA sequencing, utilize a flat surface between a mold and a surface of a CMOS created by a fan-out process, and although incorporating a TSV into the design provides this flat surface, to make the TSV, certain challenges are introduced into the processes to manufacture this structure. For example, the silicon wafer in the device is thinned by polishing from the backside to thickness of a range (e.g., about 70-140 um), which makes handling the wafer, based on this thickness, challenging. Specifically, creating this structure presents challenges handled by aspects of the processes described herein, including, but not limited to, releasing carrier glass holding the TSV while forming the bumps, and thinning the wafer.

Thus, shortcomings of the prior art can be overcome and benefits as described later in this disclosure can be achieved through the provision of a method for manufacturing a device for use in a sensor system. Various examples of the method are described below, and the method, including and excluding the additional examples enumerated below, in any combination (provided these combination are not inconsistent), overcome these shortcomings. The method comprises: obtaining a first carrier bonded to an upper surface of the silicon wafer, wherein one or more through silicon vias are extended through the silicon wafer and a passivation stack, wherein the passivation stack is disposed below a bottom surface of the silicon wafer, wherein a portion of each of the one or more through silicon vias is exposed through an opening of one or more openings in the passivation stack, wherein each exposed portion is coupled to one or more electrical contacts; de-bonding the first carrier from the upper surface of the silicon wafer; and dicing the silicon wafer into subsections comprising dies, such that each die comprises a portion of the upper surface of the silicon wafer, the portion of the upper surface of the silicon wafer comprising an active surface, at least one through silicon via of the one or more through silicon vias, at least one electrical contact of the one or more electrical contacts on a second surface of the die, the second surface of the die parallel to the active surface.

In some examples, the method also comprises forming fan-out regions, the forming comprising: coupling the active surfaces of the dies to a fan-out carrier, the coupling creating a first space adjacent to a first edge of each active surface of each die and a second space adjacent to a second edge of each active surface of each die; forming a molding layer by depositing mold on the second surfaces of the dies and in each first space and each second space to form the molding layer over the fan-out carrier; and polishing a top surface of the molding layer such that the electrical contact of the one or more electrical contacts on the second surface of each die and the polished top surface of the molding layer form a contiguous surface.

In some examples, the contiguous surface comprises flat electrical contacts of equal height and thickness.

In some examples, the method further comprises forming a metallization layer by coating metal on the contiguous surface in a pattern.

In some examples, the metallization layer comprises a fan-out redistribution layer based on the pattern distributing additional electrical contacts at locations different from locations of the electrical contact of the one or more electrical contacts on the second surface of each die.

In some examples, the metallization layer comprises an under bump layer, based on the pattern distributing additional electrical contacts at locations of the at least one electrical contact of the one or more electrical contacts on the second surface of each die.

In some examples, coating the metal on the contiguous surface comprises: utilizing a photolithography technique to create the pattern; electroplating the pattern, wherein the electroplating comprises depositing on the one or more openings, wherein the one or more openings comprise photoresist; and stripping away the photoresist to reveal the metallization layer.

In some examples, the method further comprises forming a new passivation layer on the contiguous surface to planarize the contiguous surface; forming openings in the new passivation layer to expose the at least one electrical contact of the one or more electrical contacts on the second surface of each die; and forming a metallization layer by coating metal on the new passivation layer in a pattern.

In some examples, the method further comprises depositing an electrical short prevention passivation layer on the metallization layer; and utilizing photolithography to open the electrical short prevention passivation layer at one or more locations to from electrical connection pads to the metallization layer.

In some examples, the method further comprises releasing the fan-out carrier to expose an active device surface comprising the active surfaces of the dies and surfaces of the first spaces and the second spaces contiguous with the active surfaces, the releasing comprising: attaching a second carrier to the electrical short prevention passivation layer with an adhesive material; and de-coupling the fan-out carrier from the active surfaces of the dies utilizing a technique selected from the group consisting of: applying mechanical pressure, heating the fan-out carrier, and applying a solvent.

In some examples, the second carrier is comprised of a material selected from the group consisting of: glass, silicon, metal, polyethylene terephthalate, and tape.

In some examples, the method further comprises preparing the active device surface to act as a sensor. In some examples, the preparing comprises: washing the active device surface; and processing the active device surface utilizing a technique selected from the group consisting of: spin coating the active device surface with a chemical solution, applying the chemical solution by sol-gel, spraying the active device surface with the chemical solution mechanically polishing the active device surface, and baking the active device surface.

In some examples, the method further comprises: forming a fluidic flow channel over the active device surface, comprising: attaching one or more lids to a portion of the mold to form the fluidic flow channel between the active device surface and the one or more lids; and removing the second carrier from the electrical short prevention passivation layer to create a resultant structure.

In some examples, the method further comprises: dicing the resultant structure into sub-structures, wherein each substructure comprises at least one die and at least one lid.

In some examples, the passivation stack comprises a metallization layer.

In some examples, the metallization layer comprises a redistribution layer.

In some examples, obtaining comprises fabricating the one or more electrical contacts on the one or more openings in the passivation stack.

In some examples, the fabricating is accomplished utilizing a technique selected from the group consisting of: an electroplating technique and a sputtering technique.

In some examples, the first carrier comprises a glass carrier, and wherein the carrier bonded to the active surface of the image sensor with a bonding agent selected from the group consisting of: epoxy, resin, and adhesive.

In some examples, the silicon wafer comprises a complementary metal-oxide-semiconductor.

In some examples, the method further comprises: prior to dicing the silicon wafer into subsections, placing the silicon wafer on another carrier, such that the other carrier is coupled to the passivation stack; prior to forming fan-out regions, releasing the other carrier from the silicon wafer.

In some examples, the second carrier comprises a tape, and wherein the releasing comprises applying an element selected from the group consisting of: thermal energy and ultra violet radiation.

In some examples, coupling the active surfaces of the dies to the fan-out carrier comprises forming a temporary bonding layer between the active surfaces and the fan-out carrier, wherein the temporary bonding layer protects the active surfaces during the forming of the fan-out regions.

In some examples, the molding layer is deposited to reach a height greater than a height of the at least one electrical contact on the second surface of each die.

In some examples, each die comprises a light detection device.

In some examples, forming the molding layer further comprises curing the mold to attain mechanical stability.

In some examples, the curing is at a temperature of about one hundred degrees Celsius to about one hundred and eighty degrees Celsius.

In some examples, the curing is for about thirty minutes to about three hundred minutes.

In some examples, the electrical short prevention passivation layer comprises a material selected from the group consisting of: a polyamide, an epoxy and a solder mask.

In some examples, the one or more electrical contacts comprise one or more pillar bumps.

Shortcomings of the prior art can be overcome and benefits as described later in this disclosure can be achieved through the provision of a method for manufacturing a device for use in a sensor system. Various examples of the method are described below, and the method, including and excluding the additional examples enumerated below, in any combination (provided these combination are not inconsistent), overcome these shortcomings. The method comprises: obtaining a first carrier bonded to an upper surface of the silicon wafer, wherein one or more through silicon vias are extended through the silicon wafer and a passivation stack, wherein the passivation stack is disposed below a bottom surface of the silicon wafer, wherein a portion of each of the one or more through silicon vias is exposed through an opening of one or more openings in the passivation stack; fabricating one or more pillar bumps on the openings in the passivation stack; de-bonding the first carrier from the upper surface of the silicon wafer; and dicing the silicon wafer into subsections comprising dies.

In some examples, each die of the dies comprises a portion of the upper surface of the silicon wafer, the portion of the upper surface of the silicon wafer comprising an active surface, at least one through silicon via of the one or more through silicon vias, and at least one pillar bump of the one or more pillar bumps on a second surface of the die, the second surface of the die parallel to the active surface.

In some examples, the method further comprises: coupling the active surfaces of the dies to a fan-out carrier, the coupling creating a first space adjacent to a first edge of each active surface of each die and a second space adjacent to a second edge of each active surface of each die; forming a molding layer by depositing mold on the second surfaces of the dies and in each first space and each second space to form the molding layer over the fan-out carrier; and polishing a top surface of the molding layer such that the at least one pillar bump of the one or more pillar bumps on the second surface of each die and the polished top surface of the molding layer form a contiguous surface.

In some examples, the method further comprises: forming a metallization layer by coating metal on the contiguous surface in a pattern; depositing an electrical short prevention passivation layer on the metallization layer; opening the electrical short prevention passivation layer at one or more locations to form electrical connection pads to the metallization layer; releasing the fan-out carrier to expose an active device surface comprising the active surfaces of the dies and surfaces of the first spaces and the second spaces contiguous with the active surfaces; and preparing the active device surface to act as a sensor.

In some examples, the method further comprises: attaching one or more lids to a portion of the mold to form a space for fluidic flow channel between the active device surface and the one or more lids; and dicing the resultant structure into sub-structures, wherein each substructure comprises at least one die and at least one lid, and wherein each substructure comprises the sensor system.

In some examples, the metallization layer comprises a fan-out redistribution layer based on the pattern distributing additional pillar bumps at locations different from locations of the at least one pillar bump of the one or more pillar bumps on the second surface of each die.

In some examples, the metallization layer comprises an under bump layer, based on the pattern distributing additional pillar bumps at locations of the at least one pillar bump of the one or more pillar bumps on the second surface of each die.

In some examples, releasing the fan-out carrier comprises: attaching a second carrier to the electrical short prevention passivation layer with an adhesive material; and de-coupling the fan-out carrier from the active surfaces of the dies utilizing a technique selected from the group consisting of: applying mechanical pressure, heating the fan-out carrier, and applying a solvent.

In some examples, preparing the active device surface to act as a sensor comprises: washing the active device surface; and processing the active device surface utilizing a techniques selected from the group consisting of: spin coating the active device surface with a chemical solution, applying the chemical solution by sol-gel, spraying the active device surface with the chemical solution mechanically polishing the active device surface, and baking the active device surface.

In some examples, the method further comprises: removing the second carrier from the electrical short prevention passivation layer.

Shortcomings of the prior art can be overcome and benefits as described later in this disclosure can be achieved through the provision of a method for manufacturing a device for use in a sensor system. Various examples of the method are described below, and the method, including and excluding the additional examples enumerated below, in any combination (provided these combination are not inconsistent), overcome these shortcomings. The method comprises: obtaining a first carrier bonded to an upper surface of the silicon wafer, wherein one or more through silicon vias are extended through the silicon wafer and a passivation stack, wherein the passivation stack is disposed below a bottom surface of the silicon wafer, wherein a portion of each of the one or more through silicon vias is exposed through an opening of one or more openings in the passivation stack, wherein one or more electrical contacts are disposed on the one or more openings in the passivation stack; de-bonding the first carrier from the upper surface of the silicon wafer; and dicing the silicon wafer into subsections comprising dies.

In some examples, each die comprises a portion of the upper surface of the silicon wafer, the portion of the upper surface of the silicon wafer comprising an active surface, at least one through silicon via of the one or more through silicon vias, and at least one electrical contact of the one or more electrical contacts on a second surface of the die, the second surface of the die parallel to the active surface.

In some examples, the method further comprises: fabricating the electrical contacts on the one or more openings, wherein the electrical contacts comprise pillar bumps.

In some examples, the method further comprises: coupling the active surfaces of the dies to a fan-out carrier, the coupling creating a first space adjacent to a first edge of each active surface of each die and a second space adjacent to a second edge of each active surface of each die; forming a molding layer by depositing mold on the second surfaces of the dies and in each first space and each second space to form the molding layer over the fan-out carrier; polishing a top surface of the molding layer such that the at least one electrical contact of the one or more electrical contacts on the second surface of each die and the polished top surface of the molding layer form a contiguous surface; forming a new passivation layer on the contiguous surface to planarize the contiguous surface; forming openings in the new passivation layer to expose the at least one electrical contact of the one or more electrical contacts on the second surface of each die; forming a metallization layer by coating metal on the new passivation layer in a pattern; depositing an electrical short prevention passivation layer on the metallization layer; opening the electrical short prevention passivation layer at one or more locations to form electrical connection pads to the metallization layer; releasing the fan-out carrier to expose an active device surface comprising the active surfaces of the dies and surfaces of the first spaces and the second spaces contiguous with the active surfaces; preparing the active device surface to act as a sensor; attaching one or more lids to a portion of the mold to form a space for a fluidic flow channel between the active device surface and the one or more lids; and dicing the resultant structure into sub-structures, wherein each substructure comprises at least one die and at least one lid, and wherein each substructure comprises the sensor system.

In some examples, the metallization layer comprises a fan-out redistribution layer based on the pattern distributing additional electrical contacts at locations different from locations of the at least one electrical contact of the one or more electrical contacts on the second surface of each die.

In some examples, the metallization layer comprises an under bump layer, based on the pattern distributing additional electrical contacts at locations of the at least one electrical contact of the one or more electrical contacts on the second surface of each die.

In some examples, releasing the fan-out carrier comprises: attaching a second carrier to the electrical short prevention passivation layer with an adhesive material; and de-coupling the fan-out carrier from the active surfaces of the dies utilizing a technique selected from the group consisting of: applying mechanical pressure, heating the fan-out carrier, and applying a solvent.

In some examples, preparing the active device surface to act as a sensor comprises: washing the active device surface; and processing the active device surface utilizing a techniques selected from the group consisting of: spin coating the active device surface with a chemical solution, applying the chemical solution by sol-gel, spraying the active device surface with the chemical solution mechanically polishing the active device surface, and baking the active device surface.

In some examples, the method further comprises: removing the second carrier from the electrical short prevention passivation layer.

In some examples, the one or more additional electrical contacts comprise one or more pillar bumps.

Additional features are realized through the techniques described herein. Other examples and aspects are described in detail herein and are considered a part of the claimed aspects. These and other objects, features and advantages of this disclosure will become apparent from the following detailed description of the various aspects of the disclosure taken in conjunction with the accompanying drawings.

It should be appreciated that all combinations of the foregoing aspects and additional concepts discussed in greater detail below (provided such concepts are not mutually inconsistent) are contemplated as being part of the inventive subject matter and to achieve the advantages disclosed herein.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIG. 3 depicts an example of a wafer structure that is integrated, through the workflow of FIG. 2, for example, into a flow cell;

FIG. 4 depicts an example of the initial structure of FIG. 3, with the pillar bumps;

DETAILED DESCRIPTION

Figure 1:
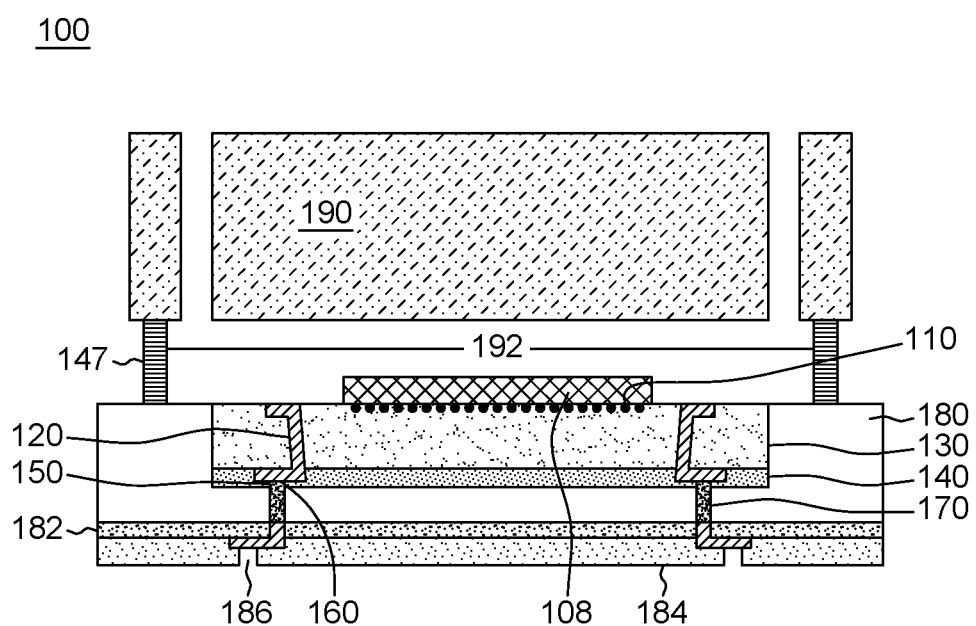
FIG. 1 depicts an example of a flow cell that includes an active (light sensitive) surface of a silicon wafer.

The accompanying figures, in which like reference numerals refer to identical or functionally similar elements throughout the separate views and which are incorporated in and form a part of the specification, further illustrate the present implementation and, together with the detailed description of the implementation, serve to explain the principles of the present implementation. As understood by one of skill in the art, the accompanying figures are provided for ease of understanding and illustrate aspects of certain examples of the present implementation. The implementation is not limited to the examples depicted in the figures.

The terms "connect," "connected," "contact" "coupled" and/or the like are broadly defined herein to encompass a variety of divergent arrangements and assembly techniques. These arrangements and techniques include, but are not limited to (1) the direct joining of one component and another component with no intervening components therebetween (i.e., the components are in direct physical contact); and (2) the joining of one component and another component with one or more components therebetween, provided that the one component being "connected to" or "contacting" or "coupled to" the other component is somehow in operative communication (e.g., electrically, fluidly, physically, optically, etc.) with the other component (notwithstanding the presence of one or more additional components therebetween). It is to be understood that some components that are in direct physical contact with one another may or may not be in electrical contact and/or fluid contact with one another. Moreover, two components that are electrically connected, electrically coupled, optically connected, optically coupled, fluidly connected or fluidly coupled may or may not be in direct physical contact, and one or more other components may be positioned therebetween.

The terms "including" and "comprising", as used herein, mean the same thing.

The terms "substantially", "approximately", "about", "relatively," or other such similar terms that may be used throughout this disclosure, including the claims, are used to describe and account for small fluctuations, such as due to variations in processing, from a reference or parameter. Such small fluctuations include a zero fluctuation from the reference or parameter as well. For example, they can refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%. If used herein, the terms "substantially", "approximately", "about", "relatively," or other such similar terms may also refer to no fluctuations.

As used herein, a "flow cell" can include a device having a lid extending over a reaction structure to form a flow channel therebetween that is in communication with a plurality of reaction sites of the reaction structure, and can include a detection device that detects designated reactions that occur at or proximate to the reaction sites. A flow cell may include a solid-state light detection or "imaging" device, such as a Charge-Coupled Device (CCD) or Complementary Metal-Oxide Semiconductor (CMOS) (light) detection device. As one specific example, a flow cell can fluidically and electrically couple to a cartridge (having an integrated pump), which can fluidically and/or electrically couple to a bioassay system. A cartridge and/or bioassay system may deliver a reaction solution to reaction sites of a flow cell according to a predetermined protocol (e.g., sequencing-by-synthesis), and perform a plurality of imaging events. For example, a cartridge and/or bioassay system may direct one or more reaction solutions through the flow channel of the flow cell, and thereby along the reaction sites. At least one of the reaction solutions may include four types of nucleotides having the same or different fluorescent labels. In some examples, the nucleotides bind to the reaction sites of the flow cell, such as to corresponding oligonucleotides at the reaction sites. The cartridge and/or bioassay system in these examples then illuminates the reaction sites using an excitation light source (e.g., solid-state light sources, such as light-emitting diodes (LEDs)). In some examples, the excitation light has a predetermined wavelength or wavelengths, including a range of wavelengths. The fluorescent labels excited by the incident excitation light may provide emission signals (e.g., light of a wavelength or wavelengths that differ from the excitation light and, potentially, each other) that may be detected by the light sensors of the flow cell.

Flow cells described herein perform various biological or chemical processes. More specifically, the flow cells described herein may be used in various processes and systems where it is desired to detect an event, property, quality, or characteristic that is indicative of a designated reaction. For example, flow cells described herein may include or be integrated with light detection devices, sensors, including but not limited to, biosensors, and their components, as well as bioassay systems that operate with sensors, including biosensors.

The flow cells facilitate a plurality of designated reactions that may be detected individually or collectively. The flow cells perform numerous cycles in which the plurality of designated reactions occurs in parallel. For example, the flow cells may be used to sequence a dense array of DNA features through iterative cycles of enzymatic manipulation and light or image detection/acquisition. As such, the flow cells may be in fluidic communication with one or more microfluidic channels that deliver reagents or other reaction components in a reaction solution to a reaction site of the flow cells. The reaction sites may be provided or spaced apart in a predetermined manner, such as in a uniform or repeating pattern. Alternatively, the reaction sites may be randomly distributed. Each of the reaction sites may be associated with one or more light guides and one or more light sensors that detect light from the associated reaction site. In one example, light guides include one or more filters for filtering certain wavelengths of light. The light guides may be, for example, an absorption filter (e.g., an organic absorption filter) such that the filter material absorbs a certain wavelength (or range of wavelengths) and allows at least one predetermined wavelength (or range of wavelengths) to pass therethrough. In some flow cells, the reaction sites may be located in reaction recesses or chambers, which may at least partially compartmentalize the designated reactions therein.

As used herein, a "designated reaction" includes a change in at least one of a chemical, electrical, physical, or optical property (or quality) of a chemical or biological substance of interest, such as an analyte-of-interest. In particular flow cells, a designated reaction is a positive binding event, such as incorporation of a fluorescently labeled biomolecule with an analyte-of-interest, for example. More generally, a designated reaction may be a chemical transformation, chemical change, or chemical interaction. A designated reaction may also be a change in electrical properties. In particular flow cells, a designated reaction includes the incorporation of a fluorescently-labeled molecule with an analyte. The analyte may be an oligonucleotide and the fluorescently-labeled molecule may be a nucleotide. A designated reaction may be detected when an excitation light is directed toward the oligonucleotide having the labeled nucleotide, and the fluorophore emits a detectable fluorescent signal. In another example of flow cells, the detected fluorescence is a result of chemiluminescence or bioluminescence. A designated reaction may also increase fluorescence (or Förster) resonance energy transfer (FRET), for example, by bringing a donor fluorophore in proximity to an acceptor fluorophore, decrease FRET by separating donor and acceptor fluorophores, increase fluorescence by separating a quencher from a fluorophore, or decrease fluorescence by co-locating a quencher and fluorophore.

As used herein, "electrically coupled" and "optically coupled" refers to a transfer of electrical energy and light waves, respectively, between any combination of a power source, an electrode, a conductive portion of a substrate, a droplet, a conductive trace, wire, waveguide, nanostructures, other circuit segment and the like. The terms electrically coupled and optically coupled may be utilized in connection with direct or indirect connections and may pass through various intermediaries, such as a fluid intermediary, an air gap and the like.

As used herein, a "reaction solution," "reaction component" or "reactant" includes any substance that may be used to obtain at least one designated reaction. For example, potential reaction components include reagents, enzymes, samples, other biomolecules, and buffer solutions, for example. The reaction components may be delivered to a reaction site in the flow cells disclosed herein in a solution and/or immobilized at a reaction site. The reaction components may interact directly or indirectly with another substance, such as an analyte-of-interest immobilized at a reaction site of the flow cell.

As used herein, the term "reaction site" is a localized region where at least one designated reaction may occur. A reaction site may include support surfaces of a reaction structure or substrate where a substance may be immobilized thereon. For example, a reaction site may include a surface of a reaction structure (which may be positioned in a channel of a flow cell) that has a reaction component thereon, such as a colony of nucleic acids thereon. In some flow cells, the nucleic acids in the colony have the same sequence, being for example, clonal copies of a single stranded or double stranded template. However, in some flow cells a reaction site may contain only a single nucleic acid molecule, for example, in a single stranded or double stranded form.

The term "fan-out" is used herein to characterize an area that is packaged with a detector that extends a horizontal distance beyond the detector. For example, in examples where a CMOS sensor is utilized as a detector in the flow cell, the fan-out refers to the additional horizontal distance on each side of the horizontal boundaries of the CMOS sensor.

As used herein, the term "pillar bump" is used to describe electrical contacts in examples illustrated and described herein. Wherever the term "pillar bump" is utilized, a variety of examples of electrical contacts can also be utilized in various embodiments of the present invention. The electrical contacts, which may be pillar bumps, may comprise an electrically conductive material, such as a metal material (e.g., Cu (copper), Au (gold), W (tungsten), Al (aluminum) or a combination thereof), but it is understood that other electrically conductive materials may be utilized.

Reference is made below to the drawings, which are not drawn to scale for ease of understanding, wherein the same reference numbers are used throughout different figures to designate the same or similar components.

Detection devices and image sensors that can be utilized in flow cells as sensors, such as biosensors, include image sensors or detectors that include a CMOS and a fan-out region. A surface of the CMOS and the fan-out region (on either side) form an active surface. Generally, to enable electrical connections in CMOS detectors, bumps are formed on a front side of the CMOS, the active surface. But when utilizing the CMOS as an image sensor, as in the examples discussed herein, this surface, including a fan-out region that extends the surface, is an active surface and its transparency impacts its utility. Thus, forming bumps to this surface would adversely impact the functionality. Instead, examples is this disclosure describe a process in which bumps are added to a backside of a CMOS image sensor, on a bond (TSV) pad, but electrical connectivity to the CMOS is maintained because one or more TSVs provide an electrical connection from the active (i.e., light sensitive) surface of the CMOS to the TSV pad (i.e., the back surface of the CMOS image sensor), by extending through a base substrate, for example, to a redistribution layer (RDL).

This disclosure describes examples of processes that enable the formation of devices (which can be utilized as sensor, such as biosensors) that include a CMOS (utilized as an image sensor or detector) with one or more TSVs providing electrical connectivity from the CMOS, through a substrate, and to a layer with bumps. This wafer is utilized in a wafer level fan-out process that enables fluidic and electrical fan-out.

Because activities for which the resultant device is utilized include a flat surface between a mold and a surface of a CMOS to accommodate a fan-out wafer, and incorporate at least one TSV, to make the TSV, in particular, certain challenges are introduced into the processes to manufacture this structure. For example, the silicon wafer is thinned by polishing from the backside to thickness of a desired range (e.g., 70-140 um), which makes handling the wafer, based on this thickness, challenging. Creating this structure presents challenges handled by aspects of the processes described herein, including, but not limited to, releasing carrier glass holding the TSV while forming the bumps, and thinning the wafer to a thickness within the aforementioned desired range.

FIG. 1 provides an example of a flow cell 100, formed utilizing methods described herein. As illustrated in the example of FIG. 1, a flow cell includes an active (light sensitive) surface 110 of a silicon wafer 130 (e.g., a CMOS), utilized for light sensing activities (e.g., DNA sequencing). A chemical coating 108 has been applied to this active surface 110. Above the active surface 110 of a silicon wafer 130, including the chemical coating 108, is a (micro)-fluidic flow channel 192, delineated by a lid 190 of the flow cell 100 on one side, and a contiguous surface including the active surface 110 of a silicon wafer 130 and portions of a molded fan-out region 180 on either side of this surface of the silicon wafer 130. The (micro)-fluidic flow channel 192 is further defined by a dam 147, on each side, also referred to as an interposer. When the silicon wafer 130 is utilized as a digital image sensor, the active surface 110 of the digital image sensor includes photo-sites or pixels for sensing light. In these examples, non-limiting examples of the function(s) of the sensor include, for example, light sensing (e.g., having a predetermined range of wavelengths sensed), detecting the presence of one or more substances (e.g., biological or chemical substance) and detecting a change in concentration of something (e.g., ion concentration).

In FIG. 1, the flow cell 100 also includes one or more TSV 120 through the silicon wafer 130 to at least of passivation layer 140 on one or more backside metallization layer layers, which are metallization layers that are RDLs, in some examples. In some examples, the passivation layer 140 is a polyamide layer that is deposited and cured at higher temperatures (e.g., about 100 C-180 C). Connections to the TSV 120, and, therefore, the silicon wafer 130 are facilitates by opening regions 150 in the passivation layer 140. These opening regions are utilized to make electrical connections to the passivation layer 140, to form pads 160. Electrical contacts, which are often referred to as pillar bumps 170 or pillar bumps, are formed on the pads 160. The pillar bumps 170 can comprise any suitable material, including an electrically conductive material. For example, the pillar bumps 170 may comprise an electrically conductive material, such as a metal material (e.g., Cu (copper), Au (gold), W (tungsten), Al (aluminum) or a combination thereof), but it is understood that other electrically conductive materials may be utilized. In one implementation, the metal (e.g., Cu (copper), Au (gold), W (tungsten), Al (aluminum) or a combination thereof), may be elemental, an alloy, or a metal-containing composite. It is noted that while the term "copper pillar bumps" is used, copper is used only as a presentative material for pillar bumps, and the pillar bumps need not consist of, or comprise, copper.

Returning to FIG. 1, pillar bumps 170 are formed on the pads 160. These pillar bumps 170 extend through a molded fan-out region 180. At least one RDL or other passivation layer 182 (e.g., polyamide) is created on the mold of the fan-out region 180. Openings are formed in the RDL or other passivation layer 182 to provide access to the pillar bumps 170 (for electrical connectivity). Another passivation layer 184 (e.g., polyamide, epoxy, solder mask, etc.) deposited on the RDL or other passivation layer 182 protects the RDL or other passivation layer 182, increases reliability, and prevents electrical shorts. Openings 186 in the other passivation layer 184 enables electrical connection pads to the RDL or other passivation layer 182.

Forming flow cells, such as that in FIG. 1, as aforementioned, include various manufacturing challenges associated with of the inclusion of the TSV and formation of pillar bumps on a backside of the silicon wafer. As illustrated herein, certain processing activities may alleviate these challenges, including but not limited to: 1) fabricating/depositing pillar bumps on an opening in an RDL using electroplating and sputtering techniques; 2) de-bonding a TSV glass carrier from the surface of CMOS to clean the (now exposed) surface of CMOS; 3) placing the resultant (after the de-bonding) thin wafer on an easy-to-release carrier or tape and frame; 4) dicing the wafer and starting the fan-out process by placing CMOS dies with pillar bumps on TSV RDL pads onto a fan-out carrier (protecting the active surface with a sacrificial/temporary bonding layer); 5) depositing mold on the fan-out wafer and carrier; 6) curing the mold; 7) polishing the wafer on the mold side to reveal the bumps; 8) metalizing the wafer (e.g., to redistribute bumps location to outside pads) forming metallization layer (e.g., second RDL (or fan-out RDL) or under bump metal (UBM) layer depending on Cu bump locations; 8) stripping photoresist deposited during electroplating so RDL and/or UBM layer(s) remains; 9) depositing a passivation layer on the RDL and/or UBM layer(s) to protect the layer(s), increase reliability and prevent electrical shorts and using photolithography techniques; 10) applying a sensor (e.g., a biosensor) to the active surface of the CMOS fan-out wafer (e.g., via spin coated, applied by sol-gel, and/or sprayed on the wafer); 11) creating a (micro)-fluidic flow channel on the CMOS; 12) removing the temporary carrier (leaving the lid (wafer level or individual) on the molded CMOS) using laser techniques or mechanically; and 13) performing singulation by mechanical means (e.g., sawing (dicing)).

Figure 2:
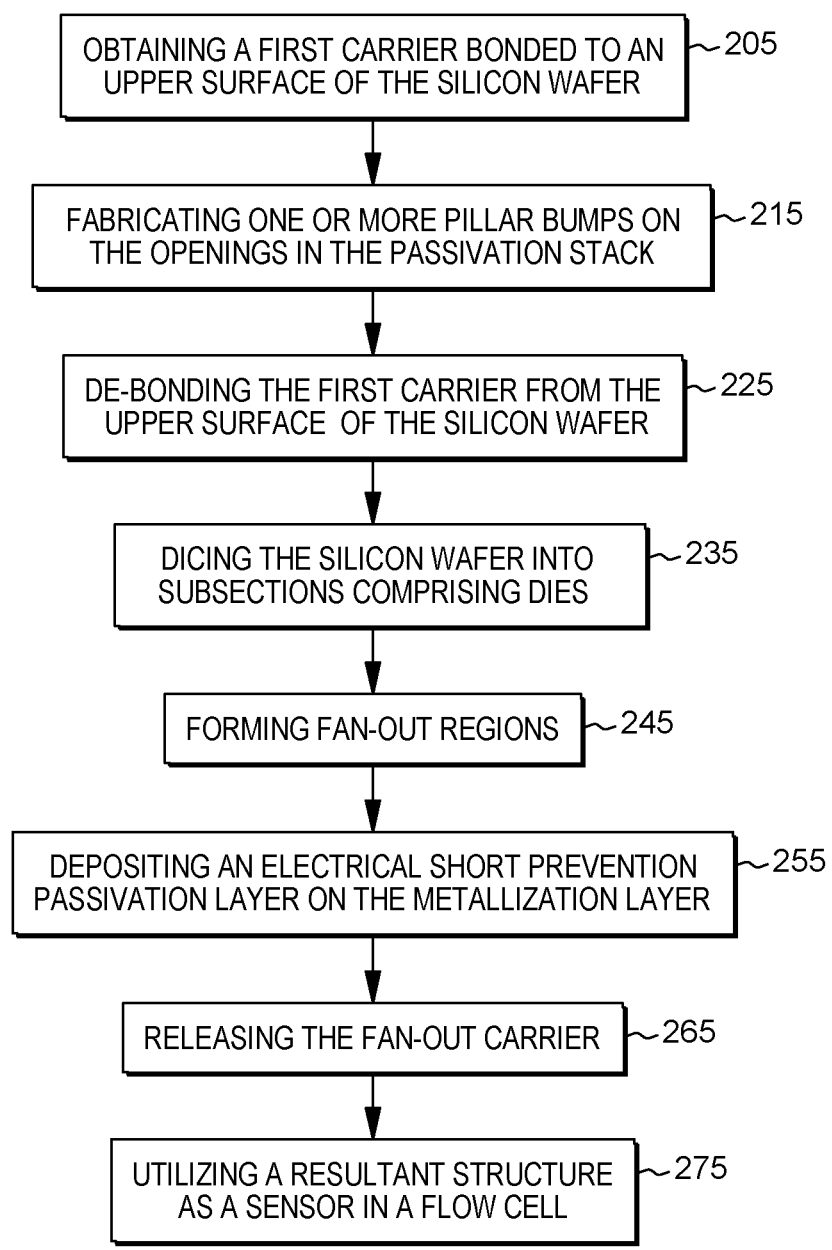
FIG. 2 depicts a workflow that illustrates a process of manufacturing a device for use in a sensor system, such as the flow cell of FIG. 1.

FIG. 2 is a workflow 200 that illustrates a process of manufacturing a device for use in a sensor system, such as the flow cell 100 of FIG. 1. In this illustrated example, the method includes obtaining a first carrier bonded (e.g., via epoxy, resin, and/or adhesive) to an upper surface of the silicon wafer (205). FIG. 3 is an illustrated example of this obtained structure 300 that includes first carrier 312 (e.g., a TSV glass carrier) bonded to an upper surface 310 of the silicon wafer 330. As illustrated in FIG. 3, (one or more) TSVs 320 are extended through the silicon wafer 330 and a passivation layer 340. The passivation layer 340 can comprise one or more layers and can also be understood, in some examples, to be a passivation stack, which can include a metallization layer, which may be a redistribution layer (RDL). This passivation layer 340 is disposed below a bottom surface 342 of the silicon wafer 330. A portion of each of the TSVs is exposed through each opening 350 in the passivation layer 340.

Returning to FIG. 2, the method further includes fabricating one or more pillar bumps on the openings in the passivation stack (215). In some examples, the obtained structure includes the pillar bumps (or other electrical contacts) and this the method does not include fabricating the contacts. FIG. 4 is an illustration of an enhanced structure 400 that includes the initial structure of FIG. 3, with the pillar bumps 470, the addition of which is noted in FIG. 2. Various ways in which this fabricating is accomplished include, but are not limited to: an electroplating technique and a sputtering technique. Referring to FIG. 4, in some examples, the pillar bumps 470 are fabricated and/or deposited on the openings 450 by using one or more of electroplating and/or sputtering techniques. This passivation layer 440 can be a RDL. The aforementioned openings 450 in the passivation layer 440, which is an RDL in some examples, are formed using one or more of electroplating and sputtering techniques. From a logistical standpoint, the fabrication of the pillar bumps 470 is sometimes accomplished in the same facility manufacturing the TSVs and/or at the facility performing the fan-out process, which will be discussed later in this disclosure. The flexibility of where certain processes may be performed is based, at least in part, on the ease with which the wafer 330, 430, can be shipped during this manufacturing, when it remains bonded with the first carrier 312, 412, which is a glass carrier in some examples. When the wafer 330, 430 and the first carrier 312, 412 remain bonded, the structure 300, 400 is more robust than without the carrier 312, 412 and can therefore be transported from one location to another to perform different portion of the method illustrated in FIG. 2.

Referring again to FIG. 2, the method illustrated also includes de-bonding the first carrier from the upper surface of the silicon wafer (225). For example, this de-bonding may be facilitated by applying a solvent to the first carrier and the upper surface of the silicon wafer to de-bond the first carrier from the upper surface of the silicon wafer and to clean the upper surface of the silicon wafer. In other examples, the de-bonding is facilitated by utilizing mechanical force, ultraviolet waves, heat, etc. The resultant structure can be placed on a second carrier, this one selected to be easy to release, such as a tape frame. This second carrier may be tape, and releasing the tape is accomplished, in some examples, through the application of one of more of thermal energy and/or ultra violet (UV) radiation. As is the case with the now de-bonded first carrier, this second carrier structurally stabilizes the structure for transportation, if necessary. The method includes, in some examples, dicing the silicon wafer into subsections comprising dies (235). At the completion of this method, each die can be utilized as a light detection device. In examples where this second carrier is utilized, it is released from the structure before forming fan-out regions (245), a process which is described in greater detail below.

Figure 5A:
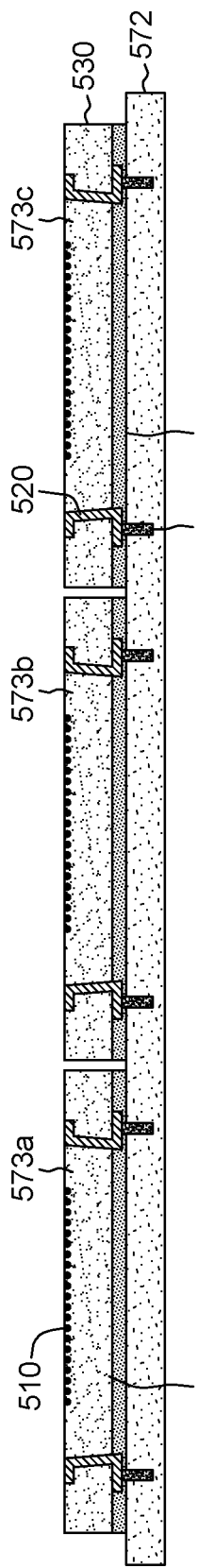
FIGS. 5A-5B depict different examples of the structure of FIG. 4 after a first carrier is de-bonded.

FIG. 5A depicts examples of dies 573a-573c (this particular number selected for illustrative purposes only) at a point in the described method after the first carrier was de-bonded, a second carrier 572 was attached, and the wafer diced. As illustrated in FIG. 5A, each die 573a-573c includes a portion of the upper (active) surface 510 of the silicon wafer 530, the portion of the upper surface of the silicon wafer comprising an active surface. In this illustrated example, each die 573a-573c also includes at least two TSVs 520, and at least two pillar bumps 570, on an eventual bottom surface 540 of the dies 573a-573c (this surface of the die is parallel to the active surface).

Figure 5B:
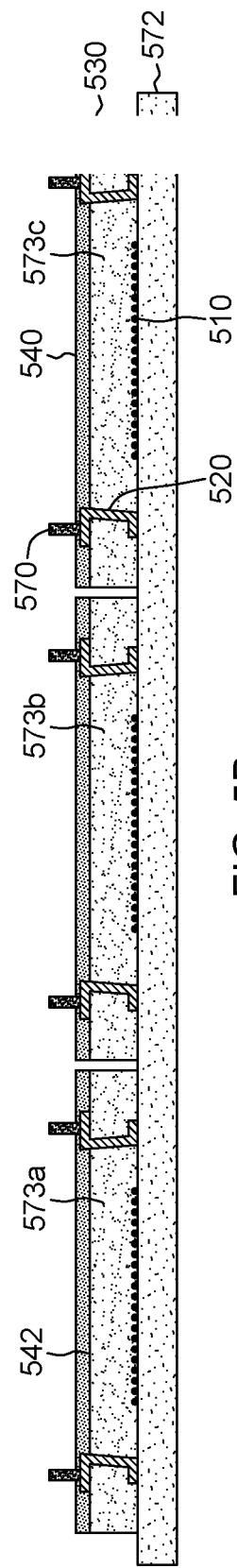

FIG. 5B also depicts examples of the dies 573a-573c at a point in the described method after the first carrier was de-bonded, a second carrier 572 was attached, and wafer diced, but instead of attaching the second carrier 572 to the what becomes the bottom surface 540 of the dies 573a-573c, the (easy-to-release) second carrier 572 (e.g., tape released with thermal energy and/or UV radiation), is attached to the active surface 510 of the wafer 530.

In some examples of this method, prior to dicing the silicon wafer into subsections (235), the silicon wafer is places on another carrier (this other carrier is coupled to the passivation stack). Prior to forming the aforementioned fan-out regions (245), the other carrier is released from the silicon wafer.

Figure 6:
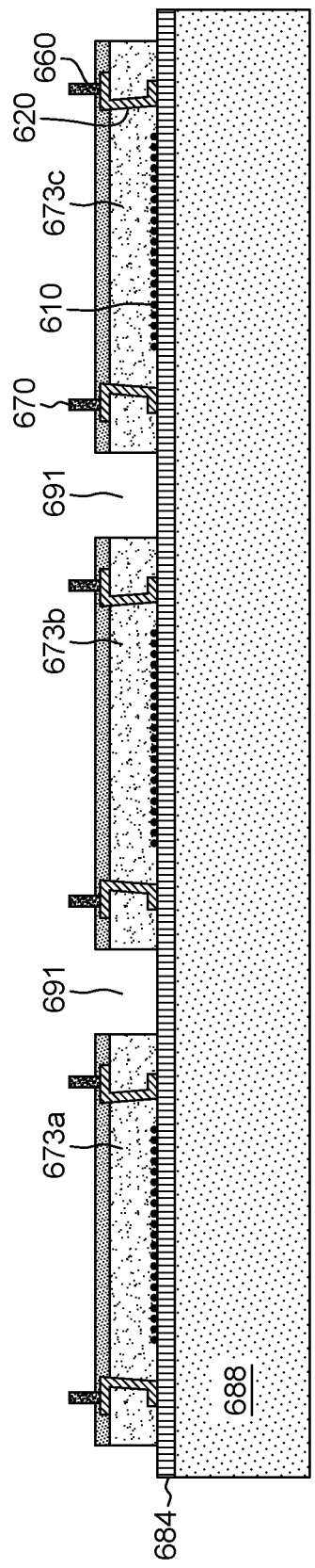
FIG. 6 is an example of the physically coupling of dies depicted in FIGS. 5A-5B, at their active surfaces, to a fan-out carrier.

Returning to FIG. 2, the illustrated method also includes, as mentioned above forming fan-out regions (245). In examples that employ an easy-to-release carrier (e.g., tape), on any surface of the wafer (as two different configurations are illustrated in FIGS. 5A-5B) these fan-out regions are formed after releasing the dies from the carrier. In some situations, a pick and place tool may be utilized to release the dies 573a-573c, from the second carrier 572. For example, a pick and place tool can be used to pick a die 573a-573c from the bottom of the second carrier 572 (e.g., tape) and release the die from the second carrier 572 by positioning vacuum probes on top of the die 573a-573c. Utilizing vacuum probes of a softer material, such as plastic, rather than metal, in some examples, may reduce and in some instances even minimize, any risk of scratching and/or chipping the silicon of the wafer 530. In examples, such as that illustrated in FIG. 5A, where pillar bumps 570 are in contact with the second carrier 572 (e.g., tape) on the tape, a flipping operation may be used with the pick-and-place tool to place the active surface 510 of the die on another carrier (see, e.g., FIG. 6, 688). Dividing any force applied during a pick and place procedure over a greater surface area can mitigate possible damage risks to sensitive areas of the silicon wafer 530, including the active surfaces 510 of the dies 573a-573c.

Figure 7:
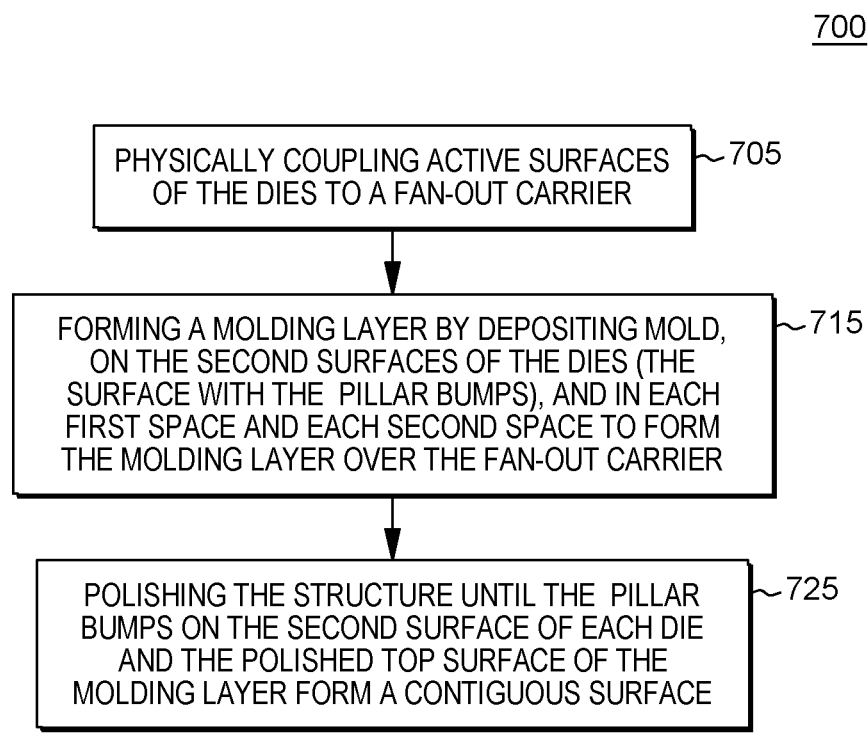
FIG. 7 depicts a workflow that illustrates examples of certain aspects of the workflow of FIG. 2 granularly, including forming fan-out regions.

FIG. 7 illustrates an example workflow 700 for forming fan-out regions (e.g., FIG. 2, 245) in more detail. Referring to FIG. 7, to form the fan-out regions, the active surfaces of the dies are physically coupled to a fan-out carrier (705). As noted above, FIG. 6 illustrates this coupling, as each die 673a-673c, at its active surface 610, is physically coupled to a fan-out carrier 688. Each of the dies 673a-673c, which include pillar bumps 670, on TSV RDL pads 660, which each connect to a TSV 620, are placed onto a fan-out carrier 688. In the example illustrated in FIG. 6, on the top of the fan-out carrier, and in immediate contact with the active surfaces 610 of the dies 673a-673c, forming a bond between the fan-out carrier 688 and the 673a-673c, is a be sacrificial or temporary bonding layer 684. The sacrificial or temporary bonding layer 684 protects the active surfaces 610 of the dies 673a-673c from mechanical and chemical processing steps as well as from debris. The placement leaves spaces 691 between the dies 673a-673c, such that there is a first space adjacent to a first edge of each active surface 610 of each die 673a-673c and a second space adjacent to a second edge of each active surface 610 of each die 673a-673c.

Figure 8:
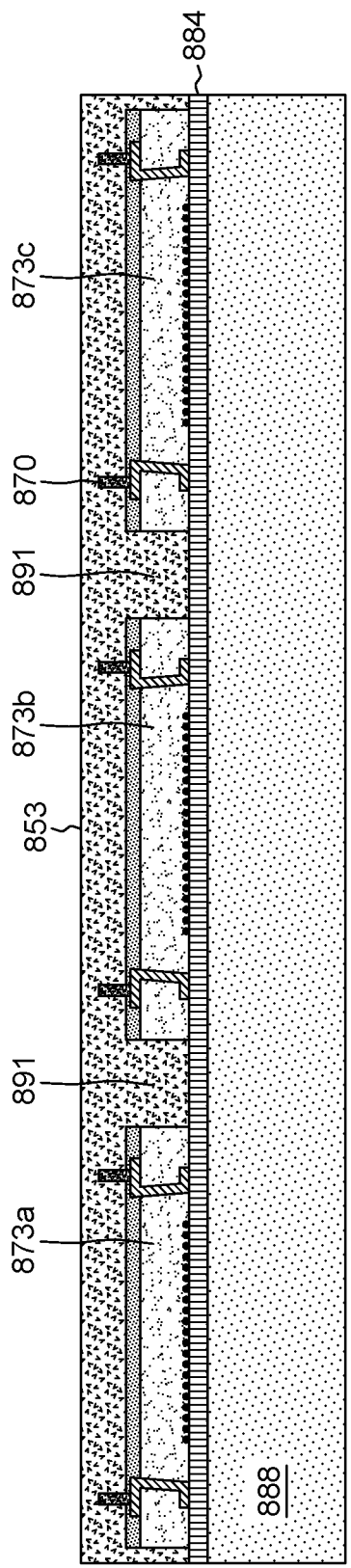
FIG. 8 illustrates a structure formed with a molding layer over dies, on the surface of the dies, with the pillar bumps.

Returning to FIG. 7, forming the fan-out regions includes forming a molding layer by depositing mold, on the second surfaces of the dies (the surface with the pillar bumps), and in each first space and each second space to form the molding layer over the fan-out carrier (715). FIG. 8 illustrates the structure formed with the molding layer 853 over the dies 873a-873c, on the surface of the dies with the pillar bumps 870. As illustrated in FIG. 8, the height and/or thickness of the mold, may be higher than the pillar bumps 870. In examples that employ this height, the increased height of the molding layer 853, above the pillar bumps 870, at this time, may compensate for the tolerances in the manufacturing of the pillar bumps 870. The mold may be cured at a temperature of about 100° C.-180° C. for a period of about 0.5-5 hours to cure the mold until such a point that the mold is mechanically stable. Referring to both FIG. 9A as well as FIG. 7, the molding layer 953 above the dies 973a-973c is polished until the pillar 970 bumps on the second surface of each die 973a-973c and the polished top surface of the molding layer 953 form a contiguous surface (725). In some examples, the contiguous surface includes flat pillar bumps, of equal height and thickness.

Returning to FIG. 2, the depicted method includes forming a metallization layer by coating metal on the contiguous surface in a pattern. In some examples, the metallization layer 1013 (shown in FIG. 10) is a wire-bondable metal stack of a combination of metals including, but not limited to, titanium, nickel (Ni), tungsten-titanium (TiW), and/or gold (Au) (e.g., Ti/Au, Ti/Ni/Au, Ni/Au, Ni/TiW/Au, Ti/Ni/TiW/Au, etc.). The thickness of the metallization layer is, for example, about 0.2 um to about Sum. The processes involved in coating the metal on the contiguous surface may include: utilizing a photolithography technique to create the pattern; electroplating the pattern; and stripping away the photoresist to reveal the metallization layer. This electroplating includes, for example, depositing the metal (during the electroplating) on the photoresist exposed in the opening regions. When the photoresist is stripped away, in some examples, as explained below, an under bump layer (UBM) or a RDL remains on the wafer. The process to form the metallization layer may include a combination of: 1) metal sputtering (blanketing the existing structure with no deliberate patterning of the metal on the wafer, in contrast with redistributing pillar bumps in a pattern at specific locations), for example, using titanium (Ti) as a seed layer; 2) a photolithography technique to create the pattern of the metallization layer; and 3) electroplating. During this electroplating, metal is deposited on photoresist opening regions, so when this photoresist is stripped away, a RDL or UBM layer remains on the wafer.

The distribution of additional pillar bumps via this metallization determines whether a next layer is an under bump layer UBM) or a RDL. Creating the pattern, in different examples of the method, includes distributing additional pillar bumps on the structure (e.g., FIG. 9A, 900) at various types of locations: at locations different from locations from those of the existing pillar bumps and/or at the locations of the existing pillar bumps (e.g., FIG. 9A, 970). The metallization layer is an under bump layer (UBM), based on the pattern distributing additional pillar bumps at the existing locations of the pillar bumps on each die. The metallization layer is a RDL, which can be understood as a fan-out RDL, based on the pattern distributing additional pillar bumps at the different locations.

Figure 9A:
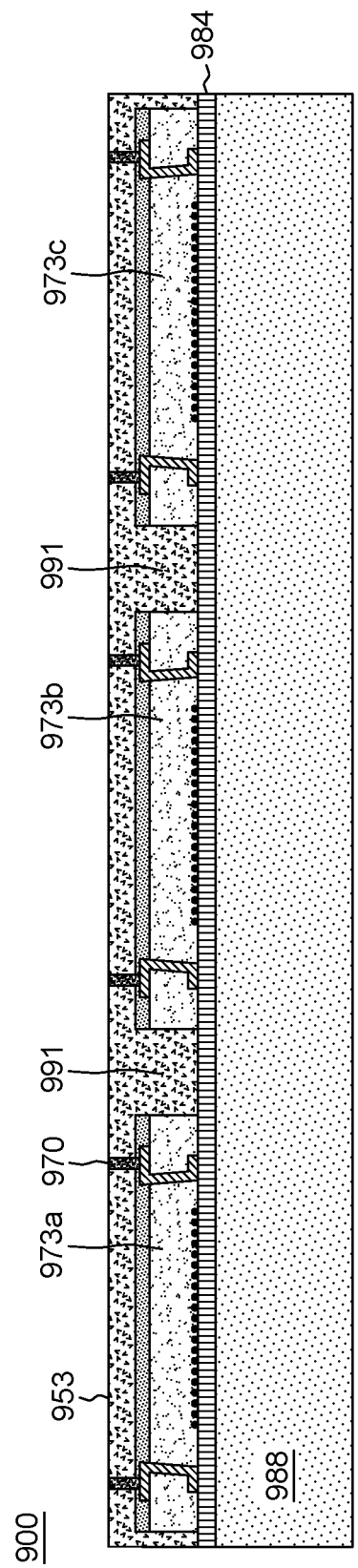
FIGS. 9A-9B illustrates examples of the structure of FIG. 8 after the molding layer is polished, resulting in a molding layer of two different heights.
Figure 9B:
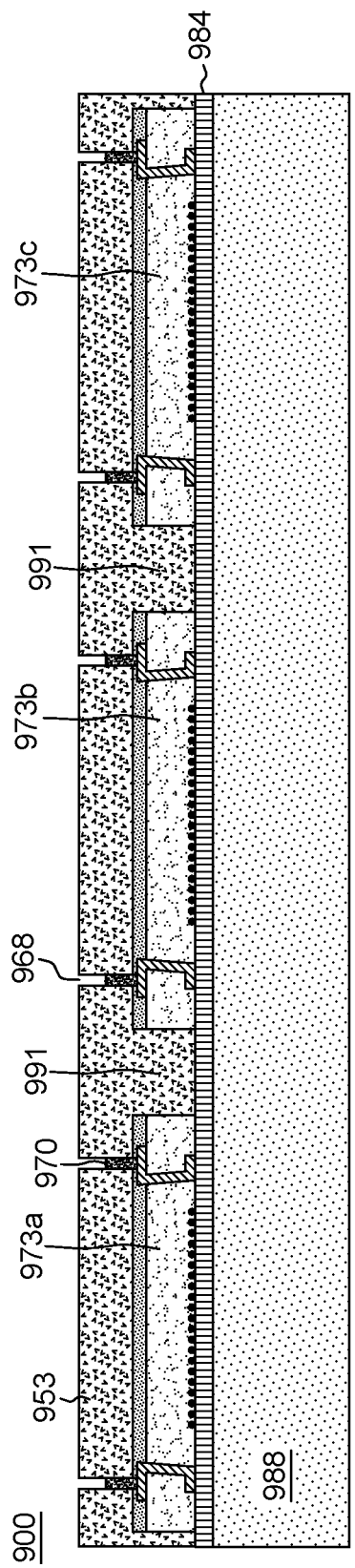

FIG. 9B is an example of a structure 900 in FIG. 9A but with a thicker layer of molding layer 953. This example may be utilized where this thicker layer is desired and based on manufacturing processes available, the pillar bumps 970 are not fabricated to be as tall as the molding layer 953. For example, dicing tape (tape upon which a wafer is situated during dicing) may not be available on the market or may not be cost effective for pillar bumps of above a certain height, for example, of about 100 um. In this example, as illustrated in FIG. 9B, the molding layer 953 may be polished and/or polished to a height to attain mechanical stability for the structure 900. Because of the height discrepancy between the molding later 953 and the pillar bumps 970, holes 968 are formed in the molding layer 953 to open a path to the pillar bumps 970, e.g., for electrical contact. Various techniques can be utilized to form the holes, including but not limited to photolithography and etching, and/or utilizing a laser drilling process in accordance with a pattern. When a metallization layer 1013 (e.g., FIG. 10) is added, as described below, adding the metallization layer 1013 fills the holes 968 with the electrically conductive material comprising the metallization layer 1013 (e.g., Cu, Ti, W, Al). In this example, the metallization both fills the holes 968 to create electrical connections, it also forms (e.g., patterned) fan-out distribution layers.

Figure 10:
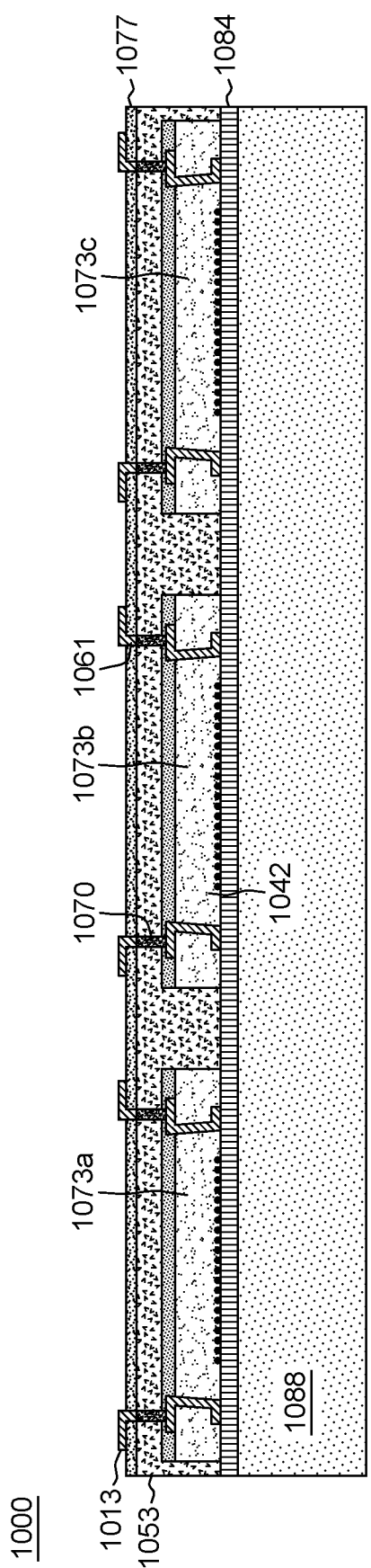
FIG. 10 illustrates an example of a structure formed through methods including the method described in FIG. 2, which includes a metallization layer, a fan-out redistribution layer, and an additional passivation layer, when compared to the structure of FIG. 9.

FIG. 10 depicts a structure 1000 that includes: 1) the aspects in FIG. 9A; 2) the aforementioned metallization layer 1013; and 3) an additional passivation layer 1077. In the example depicted in FIG. 10, the metallization layer 1013 is a fan-out RDL. In addition to adding this metallization layer 1013, the method may also include, forming the aforementioned additional passivation layer 1077 (e.g., polyamide) to create additional smoothness and planarization on the surface of the molded region 1053, which may be rough after being polished. If this additional passivation layer 1077 is added as part of a method of manufacture, it is added, and then, openings 1061 are formed to the pillar bumps 1070 before forming the metallization layer 1013. These openings 1061 may serve to expose the pillar bumps 1070 on the bottom surface 1042 of each die 1073a-1073c of the original silicon wafer.

Figure 11:
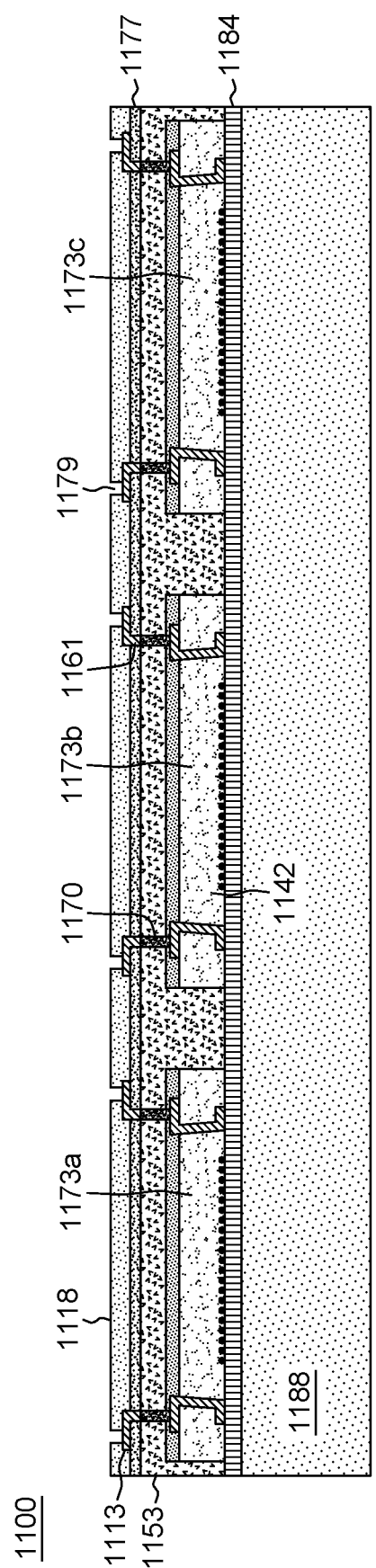
FIG. 11 depicts an example of the structure of FIG. 10 with the addition of an electrical short prevention passivation layer.

Returning to FIG. 2, in this example, the method includes depositing an electrical short prevention passivation layer on the metallization layer (255). This aspect may be referred to as metallization distribution. Thus in some instances, the passivation layer is referred to as an electrical short prevention layer because it is deposited on the RDL layer(s) (and/or UMP layer) both to increase reliability and to prevent electrical shorts. Different materials are used to form this layer including, but not limited to, polyamide, epoxy, and/or a solder mask. The layer may be opened utilizing photolithography at one or more locations to form electrical connection pads to the metallization layer. FIG. 11 depicts the structure of FIG. 10 with the addition of the electrical short prevention passivation layer 1118 (e.g., a polyamide, an epoxy, and/or a solder mask). Openings 1179 are formed in this layer as well in order to expose the pillar bumps 1170 on the bottom surface 1142 of each die 1173a-1173c of the original silicon wafer.

Figure 12A:
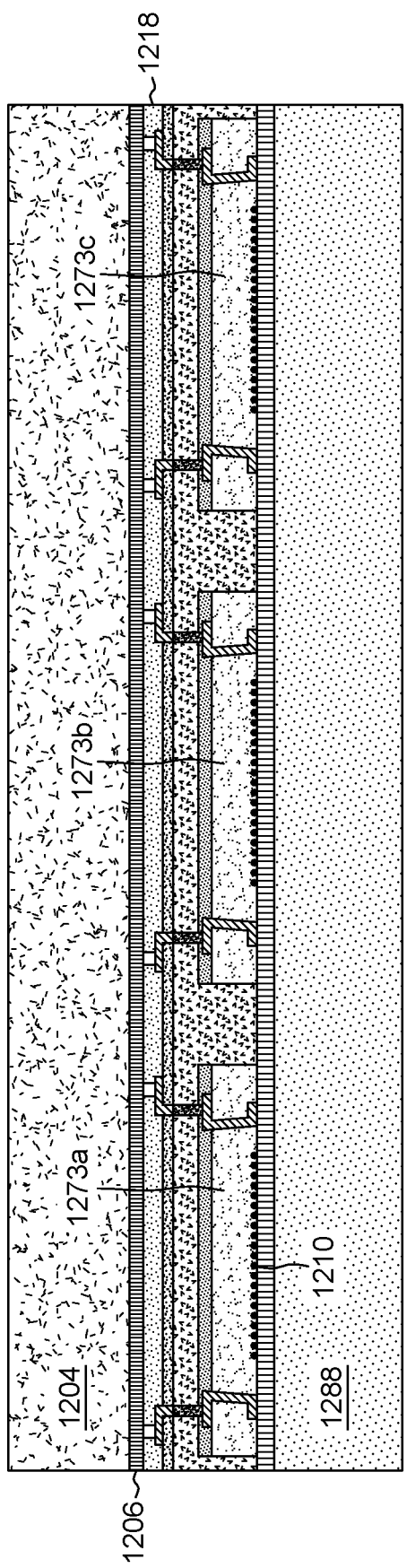
FIGS. 12A-12C illustrate a structure discussed herein at different points in a process to remove a fan-out carrier from the structure including utilizing a carrier at the backside of the structure and an addition of a coating to an active surface of the structure.
Figure 12B:
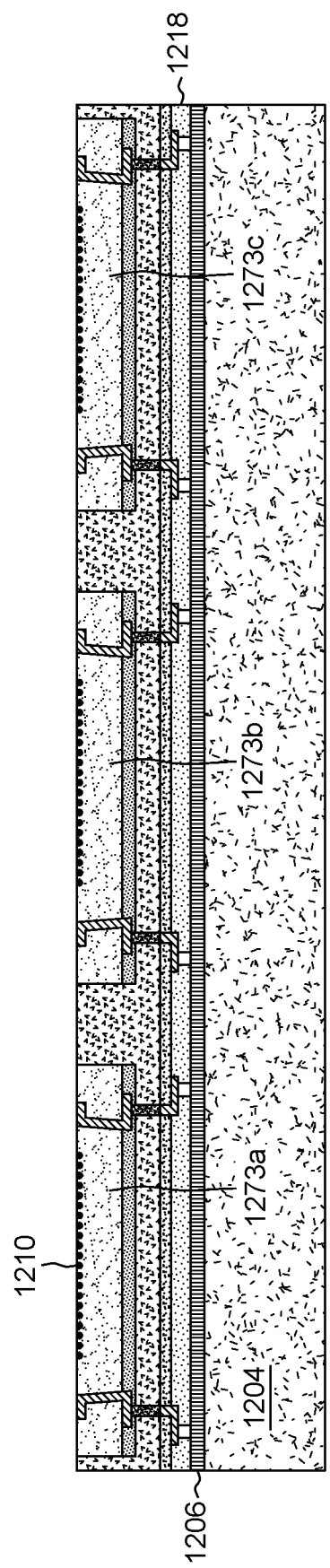

Returning to FIGS. 2 and 7, when forming fan-out regions (245), the active surfaces of the dies are physically coupled to a fan-out carrier (705), and in the example depicted in FIG. 2, this fan-out carrier is released. Thus, the method includes releasing the fan-out carrier (265). Releasing this carrier exposes an active device surface (i.e., the active surfaces of the dies and surfaces of the first spaces and the second spaces contiguous with the active surfaces). FIGS. 12A-12B illustrate the structure discussed herein at different points in a fan-out carrier removal process. As illustrated in FIG. 12A, releasing the carrier 1288 may include attaching a second carrier 1204 (e.g., glass, silicon, metal, polyethylene terephthalate, and/or tape) to the electrical short prevention passivation layer 1218 with an adhesive material. For example, this second carrier 1204 may be about 0.25 mm to about 1 mm in height. If a tape is used as the second carrier 1204, it may be about 0.1 mm to about 0.3 mm in height. A possible reason for applying the second carrier 1204 is to achieve mechanical stability during the removal of the fan-out carrier 1288.

Figure 12C:
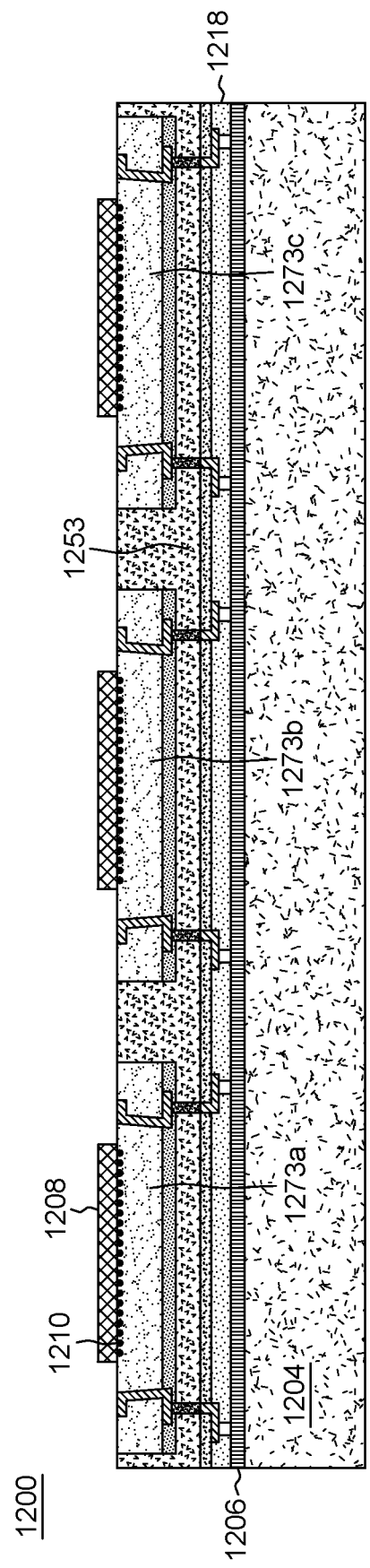

In some examples, holding this second carrier 1204 to the electrical short prevention passivation layer 1218, for example, is a temporary bonding layer 1206 such as tape (e.g., double-side) or an adhesive material (e.g., adhesive epoxy). To de-couple the fan-out carrier from the active surfaces of the dies various (layer release) techniques may be utilized, including but not limited to, applying mechanical pressure, heating the fan-out carrier, and/or applying a solvent. Once the carrier 1288 has been released, as illustrated in FIG. 12B, the active surface 1210 is prepared, per FIG. 2, so that it can be utilized as a sensor (e.g., a biosensor), for example (265). Preparing the sensor (265) may involve washing the active surface 1210 as well as processing the active surface 1210. Various techniques can be utilized in this preparation, including but not limited to: spin coating the active device surface with a chemical solution, applying the chemical solution by sol-gel, spraying the active device surface with the chemical solution mechanically polishing the active device surface, and/or baking the active surface 1210. The preparation of the surface results in the chemical coating 108 (FIG. 1). As aforementioned, the second carrier 1204 can be tape, thus, in advance of preparing the active surface 1210, this second carrier 1204 may be replaced with a more rigid carrier substance (e.g., glass, silicon, polyethylene terephthalate (PET), and/or or metal). FIG. 12C illustrates the structure 1200 of FIG. 12A-12B after the sensor has been prepared, thus, including a chemical coating 1208 on a portion of the active surface 1210 of each die 1273a-1273c.

Figure 13:
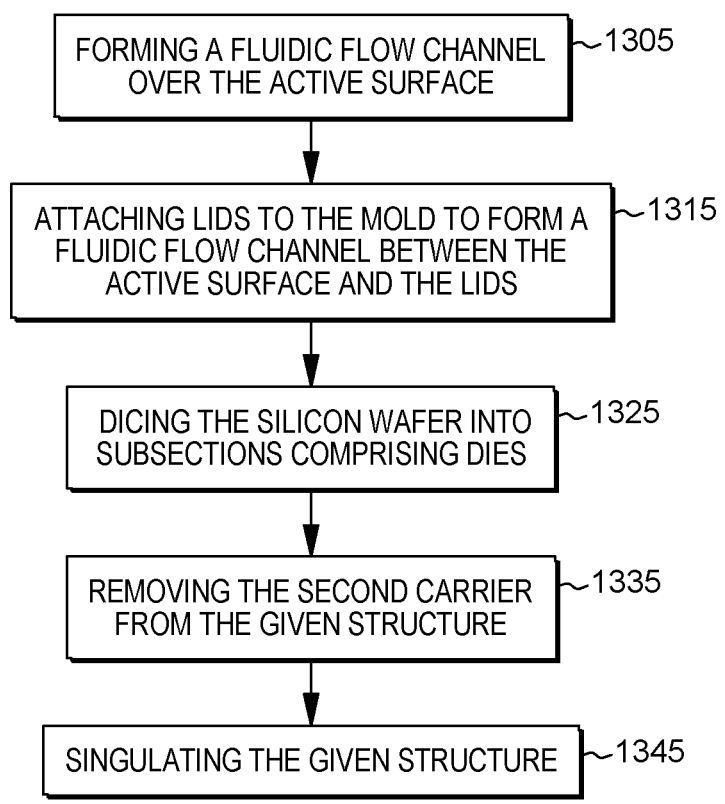
FIG. 13 depicts a workflow that illustrates examples of a process to prepare and implement structures described herein into the flow cell 100, as a sensor or detector.

Returning to FIG. 2, the method depicted includes utilizing a resultant structure as a sensor in a flow cell (275). FIG. 13 is a workflow 1300 that illustrates details of a disclosed example of a process to prepare and implement a resultant structure 1200 (e.g., FIG. 12C) into the flow cell 100 (e.g., FIG. 1), as a sensor or detector. Referring to FIG. 13, utilizing the resultant structure includes forming a fluidic flow channel (e.g., FIG. 1, 192) over the active surface (1305). Forming this channel includes, for example, attaching lids (e.g., glass lids) to the mold (e.g., FIG. 12C, 1253) to form a fluidic flow channel between the active surface (e.g., FIG. 12C, 1210) and the lids (1315). Forming the channel (e.g., FIG. 1, 192) also includes removing the second carrier (e.g., FIG. 12C, 1204) from the electrical short prevention passivation layer (e.g., FIG. 12C, 1218) (1325) to create a given structure. The process of forming the channel (e.g., FIG. 1, 192), also includes dicing the given structure into sub-structures; each substructure comprises at least one die and at least one lid (e.g., FIG. 1, 100) (1325). The sub-structures may be utilized as flow cells.

Figure 14A:
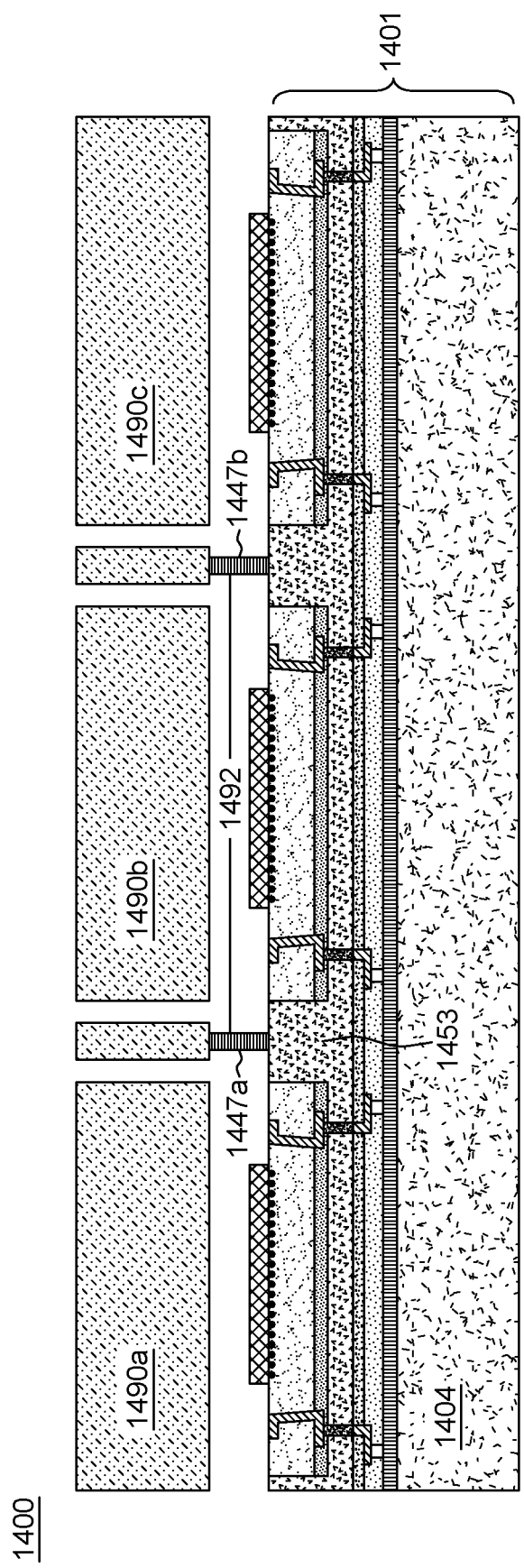
FIGS. 14A-14B depict different examples of the attachment of lids to the mold to form a fluidic flow channel between the active surfaces and the lids of flow cells formed utilizing methods disclosed herein
Figure 14B:
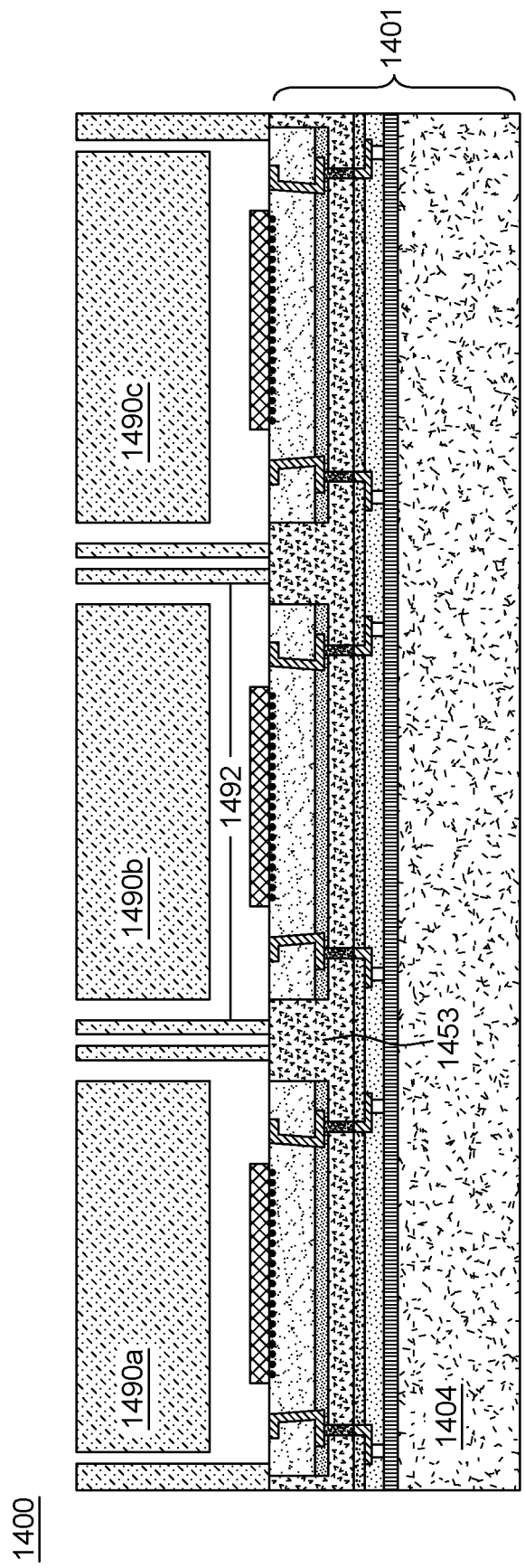

FIGS. 14A-14B show two examples of the attachment of lids to the mold (e.g., FIG. 12C, 1253) to form a fluidic flow channel between the active surface (e.g., FIG. 12C, 1210) and the lids (e.g., FIG. 13, 1315). In FIG. 14A, the lids 1490a-1490c are attached at wafer level by, in this example, by creating dams 1447a-1447b (e.g., in an epoxy or adhesive), also referred to as interposers. A (micro-)fluidic flow channel 1492 flows between the 1447a-1447b, a lid 1490a-1490c, and an active surface (e.g., FIG. 12C, 1210). In the depicted example, the dams 1447a-1447b are adhesive to bond the lids 1490a-1490c onto the structure 1401 (e.g., the wafer package), the bottom of the flow cell 1400. In some examples, the thickness of the dams 1447a-1447b is in a range of about 40 um-120 um. In FIG. 14B, individual lids 1490a-1490c are picked and placed to be mounted on the structure 1401. In this example, the lids are attached to the mold area 1453 of the structure 1401. The attachment may be accomplished with an adhesive or epoxy and subsequently temperature cured.

Referring to FIG. 13, the second carrier (e.g., FIGS. 14A-14B, 1404) is removed from the given structure (e.g., FIGS. 14A-14B, 1400) (1335). In this implementation, this removal leaves the lids (e.g., FIGS. 14A-14B, 1490a-1490c) on the structure (e.g., the wafer package, molded CMOS) (e.g., FIGS. 14A-14B, 1401). Techniques utilized to remove this carrier can include, but are not limited to, laser techniques, mechanical techniques (e.g., applying pressure or peeling of the tape or adhesive). As stated in FIG. 13, the resultant structure (after the removal of the second carrier), is singulated (1345). The singulation can be accomplished using one or more of the following techniques: dicing the resultant structure or placing the structure on dicing tape and then, dicing the structure. The dicing process may include scribing and breaking, mechanical sawing, and/or laser cutting. The dicing process may be carried out in a vertical direction. During the singulation, in some circumstances, a protective tape is applied to the lids to seal it and protect it, including preventing water from dicing procedure to leak into the flow channel.

Figure 15A:
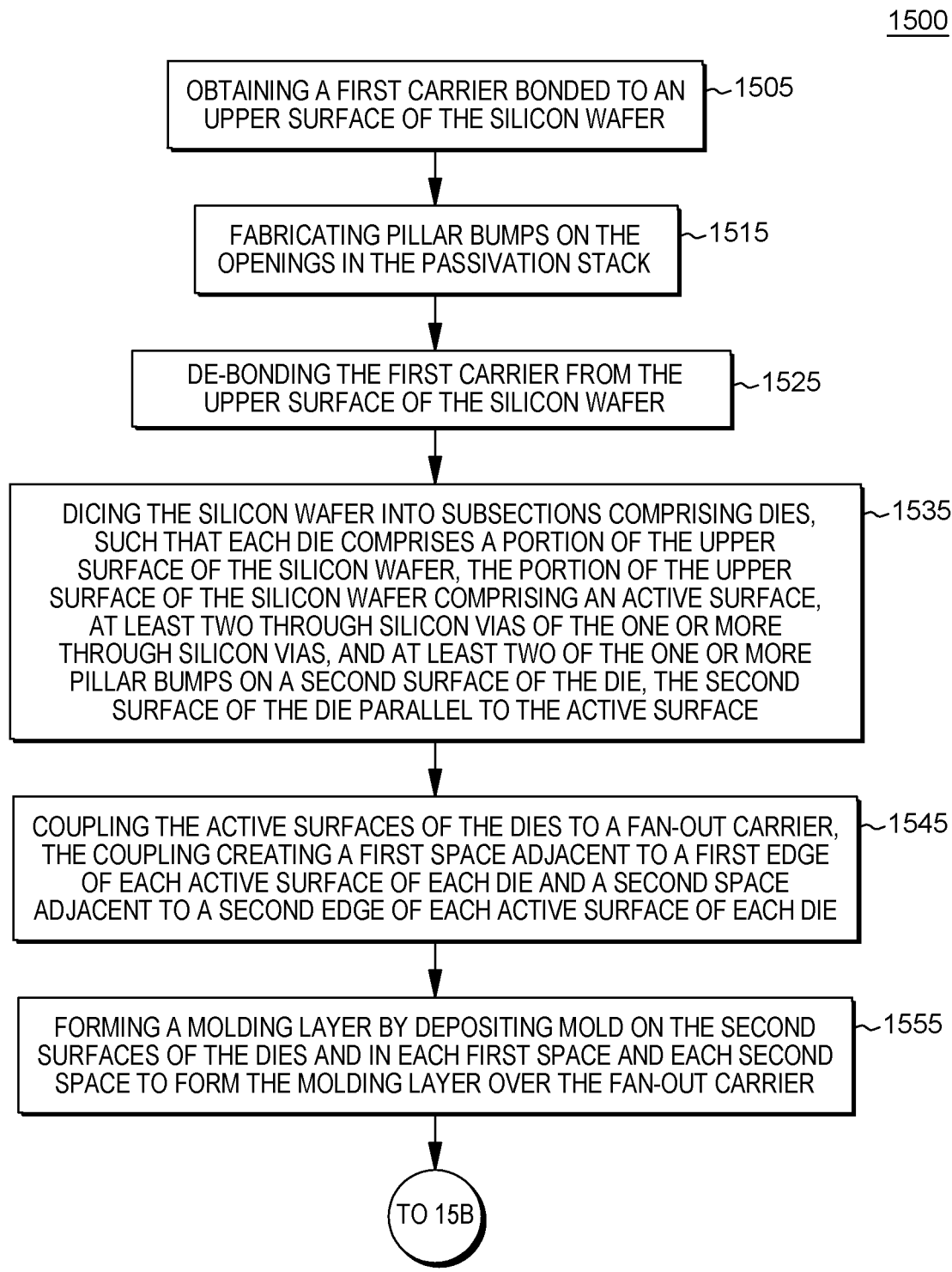
FIGS. 15A-15B are a workflow that depicts various aspects of a method for manufacturing a sensor system.
Figure 15B:
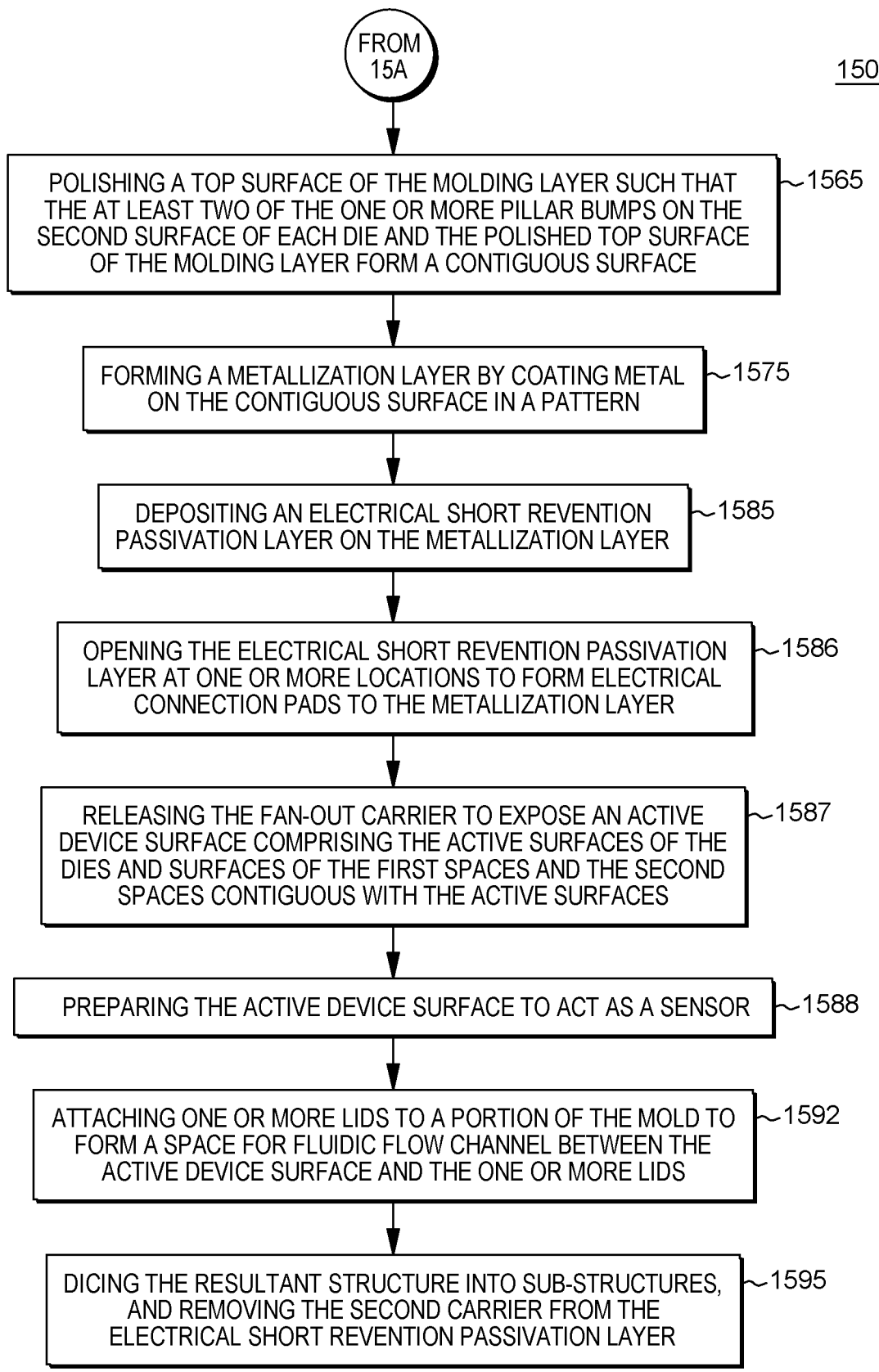

FIGS. 15A-15B are a workflow 1500 that depicts a method for manufacturing a sensor system, including but not limited to a biosensor system, such as that illustrated in FIG. 1. The method includes obtaining a first carrier bonded (e.g., via epoxy, resin, and/or adhesive) to an upper surface of the silicon wafer (1505). FIG. 3 is an illustrated example of this obtained structure 300 that includes first carrier 312 (e.g., a TSV glass carrier) bonded to an upper surface 310 of the silicon wafer 330. As illustrated in FIG. 3, (one or more) TSVs 320 are extended through the silicon wafer 330 and a passivation layer 340. The passivation layer 340 can comprise one or more layers and can also be understood, in some examples, to be a passivation stack, which can include a metallization layer, which may be a redistribution layer (RDL). This passivation layer 340 is disposed below a bottom surface 342 of the silicon wafer 330. A portion of each of the TSVs is exposed through each opening 350 in the passivation layer 340.

Returning to FIGS. 15A-15B, the method also includes fabricating pillar bumps (as an example of electrical contacts) on the openings in the passivation stack (1515). As aforementioned, FIG. 4 is an illustration of an enhanced structure 400 that includes the initial structure of FIG. 3, with the pillar bumps 470. Referring to FIG. 4, in some examples, the pillar bumps 470 are fabricated and/or deposited on the openings 450 by using one or more of electroplating and/or sputtering techniques. This passivation layer 440 can be a RDL. The aforementioned openings 450 in the passivation layer 440, which is an RDL in some examples, are formed using one or more of electroplating and sputtering techniques. The method includes de-bonding the first carrier from the upper surface of the silicon wafer (1525). For example, this de-bonding may be facilitated by various layer release techniques, including but not limited to, applying a solvent to the first carrier and the upper surface of the silicon wafer to de-bond the first carrier from the upper surface of the silicon wafer and to clean the upper surface of the silicon wafer. In other examples, the de-bonding is facilitated by utilizing mechanical force, ultraviolet waves, heat, etc.

As stated in FIGS. 15A-15B, the disclosed method may include dicing (in the illustrated example, vertically dicing) the silicon wafer into subsections comprising dies, such that each die comprises a portion of the upper surface of the silicon wafer, the portion of the upper surface of the silicon wafer comprising an active surface, at least two TSVs of the one or more TSVs, and at least two of the one or more pillar bumps on a second surface of the die, the second surface of the die parallel to the active surface (1535). This method includes coupling the active surfaces of the dies to a fan-out carrier, the coupling creating a first space adjacent to a first edge of each active surface of each die and a second space adjacent to a second edge of each active surface of each die (1545). In another aspect, the method includes forming a molding layer by depositing mold on the second surfaces of the dies and in each first space and each second space to form the molding layer over the fan-out carrier (1555). Another aspect of this example is polishing a top surface of the molding layer such that the at least two of the one or more pillar bumps on the second surface of each die and the polished top surface of the molding layer form a contiguous surface (1565).

There is an aspect in this example of forming a metallization layer by coating metal on the contiguous surface in a pattern (1575). The method continues with depositing an electrical short prevention passivation layer on the metallization layer (1585). The metallization layer may include, for example, a fan-out redistribution layer based on the pattern distributing additional pillar bumps at locations different from locations of the at least two of the one or more pillar bumps on the second surface of each die. The metallization layer can include an under bump layer, based on the pattern distributing additional pillar bumps at locations of the at least two of the one or more pillar bumps on the second surface of each die.

Returning to FIGS. 15A-15B, in this example, the method includes opening the electrical short prevention passivation layer at one or more locations to form electrical connection pads to the metallization layer (1586). The method includes releasing the fan-out carrier to expose an active device surface comprising the active surfaces of the dies and surfaces of the first spaces and the second spaces contiguous with the active surfaces (1587). To release the fan-out carrier, an example of a process utilized includes: 1) attaching a second carrier to the electrical short prevention passivation layer with an adhesive material; and 2) de-coupling the fan-out carrier from the active surfaces of the dies utilizing various layer release techniques, including but not limited to: applying mechanical pressure, heating the fan-out carrier, and applying a solvent.

Returning to FIGS. 15A-15B, the method includes preparing the active device surface to act as a sensor (1588). This preparation may involve: washing the active device surface; and processing the active device surface utilizing a techniques selected from the group consisting of: spin coating the active device surface with a chemical solution, applying the chemical solution by sol-gel, spraying the active device surface with the chemical solution mechanically polishing the active device surface, and baking the active device surface.

The method also includes attaching one or more lids to a portion of the mold to form a space for fluidic flow channel between the active device surface and the one or more lids (1592). To create the sensor system, the method includes dicing the resultant structure into sub-structures, and removing the second carrier from the electrical short prevention passivation layer (1595). Each substructure comprises at least one die and at least one lid; each substructure comprises the sensor system.

Figure 16A:
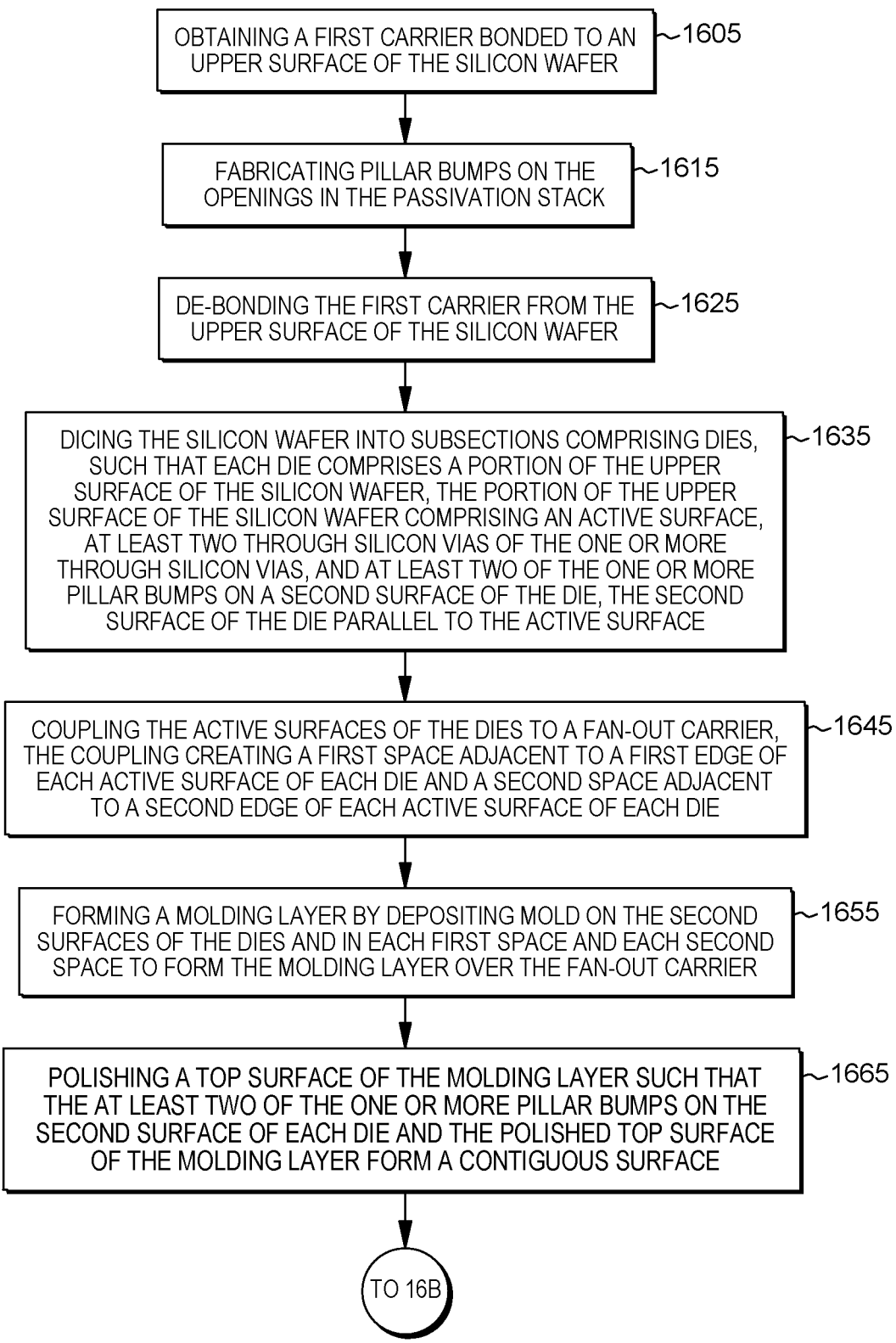
FIGS. 16A-16B are a workflow that depicts various aspects of a method for manufacturing a sensor system.
Figure 16B:
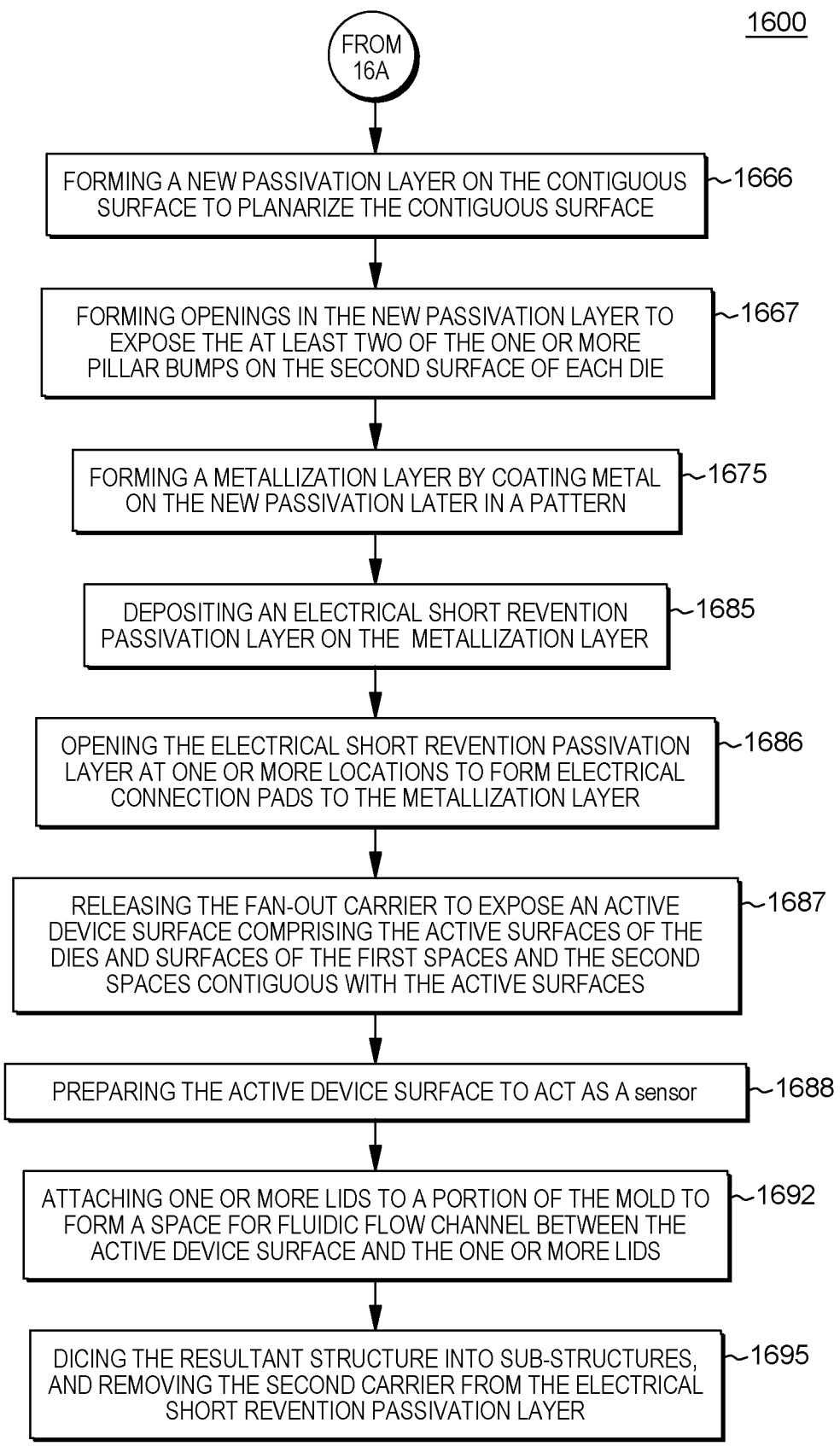

FIGS. 16A-16B are also a workflow 1600 that depicts a method for manufacturing a sensor system, such as that illustrated in FIG. 1. The method includes obtaining a first carrier bonded (e.g., via epoxy, resin, and/or adhesive) to an upper surface of the silicon wafer (1605). FIG. 3 is an illustrated example of this obtained structure 300 that includes first carrier 312 (e.g., a TSV glass carrier) bonded to an upper surface 310 of the silicon wafer 330. As illustrated in FIG. 3, (one or more) TSVs 320 are extended through the silicon wafer 330 and a passivation layer 340. The passivation layer 340 can comprise one or more layers and can also be understood, in some examples, to be a passivation stack, which can include a metallization layer, which may be a redistribution layer (RDL). This passivation layer 340 is disposed below a bottom surface 342 of the silicon wafer 330. A portion of each of the TSVs is exposed through each opening 350 in the passivation layer 340.

Returning to FIGS. 16A-16B, the method also includes fabricating pillar bumps on the openings in the passivation stack (1615). As aforementioned, FIG. 4 is an illustration of an enhanced structure 400 that includes the initial structure of FIG. 3, with the pillar bumps 470. Referring to FIG. 4, in some examples, the pillar bumps 470 are fabricated and/or deposited on the openings 450 by using one or more of electroplating and/or sputtering techniques. This passivation layer 440 can be a RDL. The aforementioned openings 450 in the passivation layer 440, which is an RDL in some examples, are formed using one or more of electroplating and sputtering techniques. The method includes de-bonding the first carrier from the upper surface of the silicon wafer (1625). For example, this de-bonding may be facilitated by applying a solvent to the first carrier and the upper surface of the silicon wafer to de-bond the first carrier from the upper surface of the silicon wafer and to clean the upper surface of the silicon wafer. In other examples, the de-bonding is facilitated by utilizing mechanical force, ultraviolet waves, heat, etc.

As stated in FIGS. 16A-16B, the disclosed method may include dicing the silicon wafer into subsections comprising dies, such that each die comprises a portion of the upper surface of the silicon wafer, the portion of the upper surface of the silicon wafer comprising an active surface, at least two through silicon vias of the one or more through silicon vias, and at least two of the one or more pillar bumps on a second surface of the die, the second surface of the die parallel to the active surface (1635). This method includes coupling the active surfaces of the dies to a fan-out carrier, the coupling creating a first space adjacent to a first edge of each active surface of each die and a second space adjacent to a second edge of each active surface of each die (1645). In another aspect, the method includes forming a molding layer by depositing mold on the second surfaces of the dies and in each first space and each second space to form the molding layer over the fan-out carrier (1655). Another aspect is polishing a top surface of the molding layer such that the at least two of the one or more pillar bumps on the second surface of each die and the polished top surface of the molding layer form a contiguous surface (1665).

This method, in contrast to FIGS. 15A-15B, also includes forming a new passivation layer on the contiguous surface to planarize the contiguous surface (1666). The method includes forming openings in the new passivation layer to expose the at least two of the one or more pillar bumps on the second surface of each die (1667).

There is an aspect in this example of forming a metallization layer by coating metal on the new passivation layer (1675). The method continues with depositing an electrical short prevention passivation layer on the metallization layer (1685). The metallization layer may include, for example, a fan-out redistribution layer based on the pattern distributing additional pillar bumps at locations different from locations of the at least two of the one or more pillar bumps on the second surface of each die. The metallization layer can include an under bump layer, based on the pattern distributing additional pillar bumps at locations of the at least two of the one or more pillar bumps on the second surface of each die.

Returning to FIGS. 16A-16B, in this example, the method includes opening the electrical short prevention passivation layer at one or more locations to form electrical connection pads to the metallization layer (1686). The method includes releasing the fan-out carrier to expose an active device surface comprising the active surfaces of the dies and surfaces of the first spaces and the second spaces contiguous with the active surfaces (1687). To release the fan-out carrier, an example of a process utilized includes: 1) attaching a second carrier to the electrical short prevention passivation layer with an adhesive material; and 2) de-coupling the fan-out carrier from the active surfaces of the dies utilizing a technique selected from the group consisting of: applying mechanical pressure, heating the fan-out carrier, and applying a solvent.

Returning to FIGS. 16A-16B, the method includes preparing the active device surface to act as a sensor (1688). This preparation may involve: washing the active device surface; and processing the active device surface utilizing a techniques selected from the group consisting of: spin coating the active device surface with a chemical solution, applying the chemical solution by sol-gel, spraying the active device surface with the chemical solution mechanically polishing the active device surface, and baking the active device surface.

The method also includes attaching one or more lids to a portion of the mold to form a space for fluidic flow channel between the active device surface and the one or more lids (1692). To create the sensor system, the method includes dicing the resultant structure into sub-structures, and removing the second carrier from the electrical short prevention passivation layer (1695). Each substructure comprises at least one die and at least one lid, and wherein each substructure comprises the sensor system (1695).

The flowchart and block diagrams in the Figures illustrate the architecture, functionality, and operation of possible implementations of systems, methods, and computer program products according to various examples of the present implementation. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more examples has been presented for purposes of illustration and description, but is not intended to be exhaustive or limited to in the form disclosed. Many modifications and variations will be apparent to those of ordinary skill in the art. The example was chosen and described in order to best explain various aspects and the practical application, and to enable others of ordinary skill in the art to understand various examples with various modifications as are suited to the particular use contemplated.

It should be appreciated that all combinations of the foregoing concepts and additional concepts discussed in greater detail below (provided such concepts are not mutually inconsistent) are contemplated as being part of the subject matter disclosed herein at least to achieve the benefits as described herein. In particular, all combinations of claims subject matter appearing at the end of this disclosure are contemplated as being part of the subject matter disclosed herein. It should also be appreciated that terminology explicitly employed herein that also may appear in any disclosure incorporated by reference should be accorded a meaning most consistent with the particular concepts disclosed herein.

This written description uses examples to disclose the subject matter, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the above description is intended to be illustrative, and not restrictive. For example, the above-described examples (and/or aspects thereof) may be used in combination with each other. In addition, many modifications may be made to adapt a particular situation or material to the teachings of the various examples without departing from their scope. While the dimensions and types of materials described herein are intended to define the parameters of the various examples, they are by no means limiting and are merely provided by way of example. Many other examples will be apparent to those of skill in the art upon reviewing the above description. The scope of the various examples should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Forms of term "based on" herein encompass relationships where an element is partially based on as well as relationships where an element is entirely based on. Forms of the term "defined" encompass relationships where an element is partially defined as well as relationships where an element is entirely defined. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular example. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the subject matter has been described in detail in connection with only a limited number of examples, it should be readily understood that the subject matter is not limited to such disclosed examples. Rather, the subject matter can be modified to incorporate any number of variations, alterations, substitutions or equivalent arrangements not heretofore described, but which are commensurate with the spirit and scope of the subject matter. Additionally, while various examples of the subject matter have been described, it is to be understood that aspects of the disclosure may include only some of the described examples. Also, while some examples are described as having a certain number of elements it will be understood that the subject matter can be practiced with less than or greater than the certain number of elements. Accordingly, the subject matter is not to be seen as limited by the foregoing description, but is only limited by the scope of the appended claims.

What is claimed is:

1. A method comprising:
    obtaining a first carrier bonded to an upper surface of the silicon wafer, wherein one or more through silicon vias are extended through the silicon wafer and a passivation stack, wherein the passivation stack is disposed below a bottom surface of the silicon wafer, wherein a portion of each of the one or more through silicon vias is exposed through an opening of one or more openings in the passivation stack, wherein each exposed portion is coupled to one or more electrical contacts;
    de-bonding the first carrier from the upper surface of the silicon wafer; and
    dicing the silicon wafer into subsections comprising dies, such that each die comprises a portion of the upper surface of the silicon wafer, the portion of the upper surface of the silicon wafer comprising an active surface, at least one through silicon via of the one or more through silicon vias, and at least one electrical contact of the one or more electrical contacts on a second surface of the die, the second surface of the die parallel to the active surface.

2. The method of claim 1, further comprising:
    forming fan-out regions, the forming comprising:
        coupling the active surfaces of the dies to a fan-out carrier, the coupling creating a first space adjacent to a first edge of each active surface of each die and a second space adjacent to a second edge of each active surface of each die;
        forming a molding layer by depositing mold on the second surfaces of the dies and in each first space and each second space to form the molding layer over the fan-out carrier; and
        polishing a top surface of the molding layer such that the at least one electrical contact of the one or more electrical contacts on the second surface of each die and the polished top surface of the molding layer form a contiguous surface.

3. The method of claim 2, wherein the contiguous surface comprises flat electrical contacts of equal height and thickness.

4. The method of claim 2, further comprising:
forming a metallization layer by coating metal on the contiguous surface in a pattern.

5. The method of claim 4, wherein the metallization layer comprises a layer selected from the group consisting of: a fan-out redistribution layer based on the pattern distributing additional electrical contacts at locations different from locations of the at least one electrical contact of the one or more electrical contacts on the second surface of each die, and an under bump layer, based on the pattern distributing additional electrical contacts at locations of the at least one electrical contact of the one or more electrical contacts on the second surface of each die.

6. The method of claim 4, wherein coating the metal on the contiguous surface comprises:
utilizing a photolithography technique to create the pattern;
electroplating the pattern, wherein the electroplating comprises depositing on the one or more openings, wherein the one or more openings comprise photoresist; and
stripping away the photoresist to reveal the metallization layer.

7. The method of claim 4, further comprising:
depositing an electrical short prevention passivation layer on the metallization layer; and
utilizing photolithography to open the electrical short prevention passivation layer at one or more locations to from electrical connection pads to the metallization layer.

8. The method of claim 7, further comprising, releasing the fan-out carrier to expose an active device surface comprising the active surfaces of the dies and surfaces of the first spaces and the second spaces contiguous with the active surfaces, the releasing comprising:
attaching a second carrier to the electrical short prevention passivation layer with an adhesive material; and
de-coupling the fan-out carrier from the active surfaces of the dies utilizing a technique selected from the group consisting of: applying mechanical pressure, heating the fan-out carrier, and applying a solvent.

9. The method of claim 7, further comprising:
preparing the active device surface to act as a sensor, the preparing comprising:
washing the active device surface; and
processing the active device surface.

10. The method of claim 9, further comprising:
forming a fluidic flow channel over the active device surface, comprising:
attaching one or more lids to a portion of the mold to form the fluidic flow channel between the active device surface and the one or more lids; and
removing the second carrier from the electrical short prevention passivation layer to create a resultant structure.

11. The method of claim 10, further comprising:
dicing the resultant structure into sub-structures, wherein each substructure comprises at least one die and at least one lid.

12. The method of claim 2, further comprising:
forming a new passivation layer on the contiguous surface to planarize the contiguous surface;
forming openings in the new passivation layer to expose the at least one electrical contact of the one or more electrical contacts on the second surface of each die; and
forming a metallization layer by coating metal on the new passivation layer in a pattern.

13. The method of claim 2, wherein coupling the active surfaces of the dies to the fan-out carrier comprises forming a temporary bonding layer between the active surfaces and the fan-out carrier, wherein the temporary bonding layer protects the active surfaces during the forming of the fan-out regions.

14. The method of claim 2, wherein forming the molding layer further comprises curing the mold to attain mechanical stability, and wherein the molding layer is deposited to reach a height greater than a height of the at least one electrical contact on the second surface of each die.

15. The method of claim 1, wherein the passivation stack comprises a metallization layer.

16. The method of claim 15, wherein the metallization layer comprises a redistribution layer.

17. The method of claim 1, wherein the obtaining comprises fabricating the one or more electrical contacts on the one or more openings in the passivation stack.

18. The method of claim 1, further comprising:
prior to dicing the silicon wafer into subsections, placing the silicon wafer on a second carrier, such that the second carrier is coupled to the passivation stack;
prior to forming fan-out regions, releasing the second carrier from the silicon wafer.

19. A method comprising:
obtaining a first carrier bonded to an upper surface of the silicon wafer, wherein one or more through silicon vias are extended through the silicon wafer and a passivation stack, wherein the passivation stack is disposed below a bottom surface of the silicon wafer, wherein a portion of each of the one or more through silicon vias is exposed through an opening of one or more openings in the passivation stack;
fabricating one or more pillar bumps on the openings in the passivation stack;
de-bonding the first carrier from the upper surface of the silicon wafer; and
dicing the silicon wafer into subsections comprising dies.

20. A method comprising:
obtaining a first carrier bonded to an upper surface of the silicon wafer, wherein one or more through silicon vias are extended through the silicon wafer and a passivation stack, wherein the passivation stack is disposed below a bottom surface of the silicon wafer, wherein a portion of each of the one or more through silicon vias is exposed through an opening of one or more openings in the passivation stack, wherein one or more electrical contacts are disposed on the one or more openings in the passivation stack;
de-bonding the first carrier from the upper surface of the silicon wafer; and
dicing the silicon wafer into subsections comprising dies.

* * * * *